(12) United States Patent
Sung et al.

(10) Patent No.: US 11,818,940 B2
(45) Date of Patent: Nov. 14, 2023

(54) ELECTRONIC APPARATUS INCLUDING AN ELECTRONIC MODULE AND METHOD OF MANUFACTURING THE SAME

(71) Applicant: SAMSUNG DISPLAY CO., LTD., Yongin-si (KR)

(72) Inventors: Woo Yong Sung, Seoul (KR); Junghan Seo, Hwaseong-si (KR); Seungyong Song, Suwon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 193 days.

(21) Appl. No.: 16/864,989

(22) Filed: May 1, 2020

(65) Prior Publication Data

US 2021/0005683 A1    Jan. 7, 2021

(30) Foreign Application Priority Data

Jul. 5, 2019    (KR) ........................ 10-2019-0081486

(51) Int. Cl.
| | | |
|---|---|---|
| *H10K 59/65* | (2023.01) | |
| *H10K 50/86* | (2023.01) | |
| *H10K 50/844* | (2023.01) | |
| *H10K 50/842* | (2023.01) | |
| *H10K 59/123* | (2023.01) | |
| *H10K 71/00* | (2023.01) | |
| *H10K 59/12* | (2023.01) | |

(52) U.S. Cl.
CPC ........... *H10K 59/65* (2023.02); *H10K 50/844* (2023.02); *H10K 50/8426* (2023.02); *H10K 50/86* (2023.02); *H10K 59/123* (2023.02); *H10K 71/00* (2023.02); *H10K 59/1201* (2023.02)

(58) Field of Classification Search
CPC ............. H01L 51/5246; H01L 51/5253; H01L 51/5281; H01L 51/56; H01L 27/3234; H01L 27/3248; H01L 2227/323
See application file for complete search history.

(56) References Cited

U.S. PATENT DOCUMENTS

| | | |
|---|---|---|
| 9,997,738 B2 | 6/2018 | Choi et al. |
| 10,128,461 B2 | 11/2018 | Kang et al. |
| 10,188,191 B2 | 1/2019 | Kang et al. |
| 10,304,913 B2 | 5/2019 | Choi et al. |
| 10,372,085 B2 | 8/2019 | Kang et al. |

(Continued)

FOREIGN PATENT DOCUMENTS

| | | |
|---|---|---|
| JP | 5117472 | 10/2012 |
| KR | 1020160147116 | 12/2016 |

(Continued)

*Primary Examiner* — Shaun M Campbell
(74) *Attorney, Agent, or Firm* — F. CHAU & ASSOCIATES, LLC

(57) ABSTRACT

An electronic apparatus includes an electronic module that outputs or receives light, and an electronic panel that is divided into a first region overlapping the electronic module, a second region surrounding at least a portion of the first region, and a third region adjacent to the second region. The electronic panel includes a base substrate, a plurality of pixels that are disposed on the base substrate and display light on the second region, an encapsulation layer that is disposed on the base substrate and covers the pixels, and a boundary pattern on the first region. The boundary pattern has an undercut shape.

20 Claims, 29 Drawing Sheets

(56) References Cited

U.S. PATENT DOCUMENTS

| | | | |
|---|---|---|---|
| 10,431,772 B2 | 10/2019 | Choi et al. | |
| 10,497,900 B2 | 12/2019 | Choi et al. | |
| 10,609,826 B2 | 3/2020 | Choi et al. | |
| 11,068,089 B1* | 7/2021 | Kim | G06V 40/1318 |
| 2011/0108812 A1 | 5/2011 | Sumita et al. | |
| 2017/0150618 A1 | 5/2017 | Ochi et al. | |
| 2017/0235398 A1 | 8/2017 | Choi et al. | |
| 2017/0287992 A1* | 10/2017 | Kwak | G06F 1/1686 |
| 2018/0047800 A1* | 2/2018 | Choi | H01L 27/322 |
| 2019/0043452 A1 | 2/2019 | Silvanto et al. | |
| 2019/0081273 A1* | 3/2019 | Sung | H01L 51/52 |
| 2019/0157614 A1* | 5/2019 | Choi | H01L 51/0096 |
| 2019/0246018 A1 | 8/2019 | Rho et al. | |
| 2019/0252475 A1* | 8/2019 | Sung | H04N 23/55 |
| 2020/0243794 A1* | 7/2020 | Jones | G02F 1/13338 |
| 2021/0375999 A1* | 12/2021 | Xu | H01L 51/5284 |

FOREIGN PATENT DOCUMENTS

| | | |
|---|---|---|
| KR | 1020170019553 | 2/2017 |
| KR | 1020170059527 | 5/2017 |
| KR | 1020170059537 | 5/2017 |
| KR | 1020170059864 | 5/2017 |
| KR | 1020170065059 | 6/2017 |
| KR | 1020170066767 | 6/2017 |
| KR | 1020170095444 | 8/2017 |
| KR | 1020170096565 | 8/2017 |
| KR | 1020180026288 | 3/2018 |
| KR | 1020180042351 | 4/2018 |
| KR | 1020190029830 | 3/2019 |
| KR | 101964692 | 4/2019 |

\* cited by examiner

US 11,818,940 B2

ELECTRONIC APPARATUS INCLUDING AN ELECTRONIC MODULE AND METHOD OF MANUFACTURING THE SAME

CROSS-REFERENCE TO RELATED APPLICATION

This U.S. nonprovisional application claims priority under 35 U.S.C § 119 to Korean Patent Application No. 10-2019-0081486 filed on Jul. 5, 2019 in the Korean Intellectual Property Office, the entire contents of which are hereby incorporated by reference.

TECHNICAL FIELD

The present inventive concepts relate to an electronic apparatus and more particularly, to an electronic apparatus including an electronic module and a method of manufacturing the same.

DISCUSSION OF THE RELATED ART

An electronic apparatus may include a display unit that displays images and a sensing unit that detects external input. The display unit may be an organic light emitting diode (OLED) display panel which has a lower power consumption, higher luminance, and faster response speed than some other types of display panels.

The electronic apparatus may include an electronic module that receives external signals and/or externally provides output signals. An external casing accommodates the electronic module together with a display panel, so as to constitute the electronic apparatus.

SUMMARY

An electronic apparatus includes an electronic module that outputs and/or receives light. The electronic apparatus further includes an electronic panel which, when viewed in plan, is divided into a first region that overlaps the electronic module, a second region that surrounds at least a portion of the first region, and a third region that is adjacent to the second region. The electronic panel includes a base substrate, a plurality of pixels that are disposed on the base substrate and display light on the second region, an encapsulation layer that is disposed on the base substrate and covers the pixels, and a boundary pattern disposed in the first region. The boundary pattern has an undercut shape when viewed in cross-section.

In certain embodiments, the first region may include a central region and a pattern region that at least partially surrounds the central region. The boundary pattern may be spaced apart from the central region and may be disposed along the pattern region.

In certain embodiments, the boundary pattern may have a closed line shape that at least partially surrounds the central region.

In certain embodiments, the encapsulation layer may include a first inorganic layer, a second inorganic layer disposed on the first inorganic layer, and an organic layer disposed between the first inorganic layer and the second inorganic layer. The first inorganic layer might not overlap the central region.

In certain embodiments, the second inorganic layer may at least partially overlap the central region.

In certain embodiments, the second inorganic layer may have a transmittance of visible light that is greater than a transmittance of visible light of the first inorganic layer.

In certain embodiments, the electronic apparatus may further include a window disposed on the encapsulation layer and an antireflection layer disposed between the window and the electronic panel. The antireflection layer layer may include a hole that corresponds to the central region. The hole may have a transmittance of visible light that is greater than a transmittance of visible light of any other part of the antireflection layer.

In certain embodiments, the hole may have a polarization degree that is less than a polarization degree of any other part of the antireflection layer.

In certain embodiments, the hole may penetrate the antireflection layer.

In certain embodiments, the electronic apparatus may further include a sensing unit disposed on the encapsulation layer. The sensing unit may include a plurality of conductive patterns and a plurality of sensing insulation layers disposed between the conductive patterns. When viewed in plan, the sensing insulation layers may at least partially overlap the central region.

In certain embodiments, the electronic apparatus may further comprise a planarization pattern disposed under the sensing unit. When viewed in plan, the planarization pattern may at least partially overlap the central region.

In certain embodiments, the boundary pattern may include a first layer, a second layer, and a third layer that are sequentially stacked. When viewed in cross-section, a lateral surface of the third layer may protrude from a lateral surface of the second layer.

In certain embodiments, the third layer may include a material different from a material of the second layer.

In certain embodiments, the boundary pattern may be electrically conductive.

In certain embodiments, each of the plurality of pixels may include a light emitting element disposed in the second region. A thin film transistor may be connected to the light emitting element. The boundary pattern may be disposed on a same layer as a control electrode of the thin film transistor, an input electrode of the thin film transistor, and/or an output electrode of the thin film transistor.

An electronic apparatus includes an electronic module and an electronic panel. The electronic panel, when in a plan view, is divided into a high-transmission region that at least partially overlaps the electronic module and an active region that at least partially surrounds the high-transmission region. The high-transmission region includes a central region that is spaced apart from the active region. The electronic panel includes a plurality of pixels that provide the active region with light, a boundary pattern disposed in the high-transmission region, the boundary pattern being spaced apart from the central region and surrounding the central region, when in a plan view, and an encapsulation layer that at least partially covers the pixels, the encapsulation layer including a first inorganic layer, a second inorganic layer that is disposed on the first inorganic layer and has a transmittance of visible light that is greater than a transmittance of visible light of the first inorganic layer, and an organic layer disposed between the first inorganic layer and the second inorganic layer. When in a plan view, the first inorganic layer may be spaced apart from the central region.

In certain embodiments, each of the plurality of pixels may include a light emitting element disposed in the active region and a thin film transistor connected to the light emitting element. The boundary pattern may be disposed on a same layer as an input electrode of the thin film transistor, an output electrode of the thin film transistor, and/or a control electrode of the thin film transistor. The boundary pattern may include a material that is the same as a material of the input, output, and/or control electrodes.

In certain embodiments, the boundary pattern may have an undercut shape when viewed in cross-section.

In certain embodiments, when in a plan view, the boundary pattern may have a closed line shape that at least partially surrounds the central region.

In certain embodiments, when in a plan view, the second inorganic layer may at least partially overlap the central region.

A method of manufacturing an electronic apparatus includes forming on a base substrate a boundary pattern and a plurality of pixels. A first inorganic layer is formed that covers the pixels and the boundary pattern. A cleaning solution is provided to clean the first inorganic layer. An organic layer and a second inorganic layer are formed on the first inorganic layer. The step of cleaning the first inorganic layer includes delaminating a portion of the first inorganic layer from the boundary pattern.

In certain embodiments, the first inorganic layer may have a transmittance of visible light that is less than a transmittance of visible light of the second inorganic layer.

In certain embodiments, the boundary pattern may include a first layer, a second layer, and a third layer that are sequentially stacked. The second layer may be undercut with respect to the third layer.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein.

DETAILED DESCRIPTION OF THE DRAWINGS

Figure 1A:
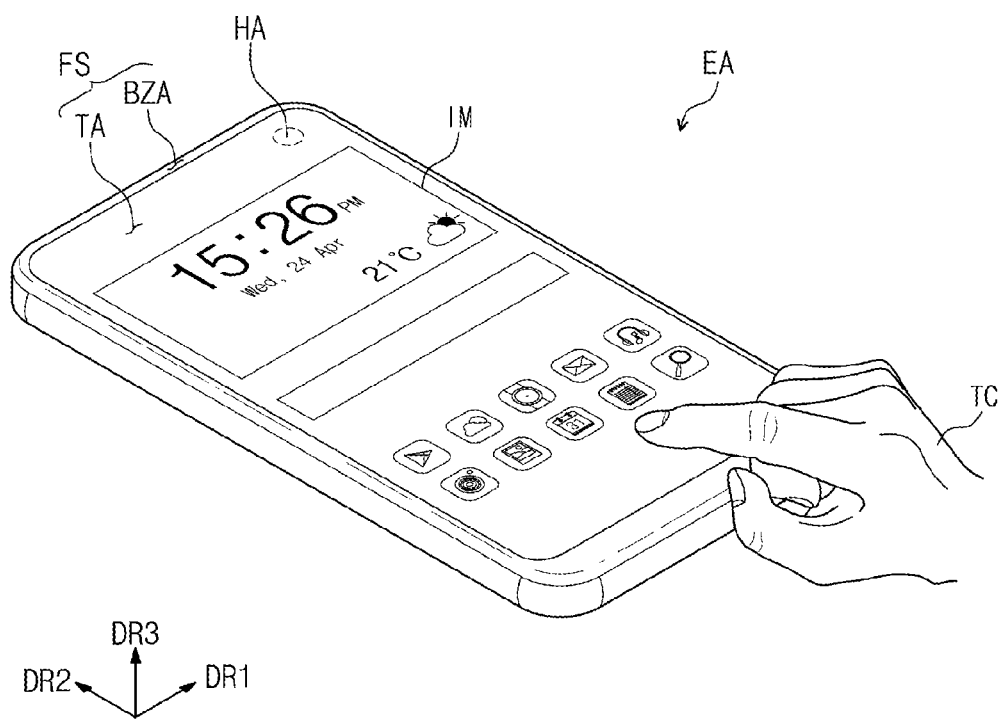
FIG. 1A is an assembled perspective view illustrating an electronic apparatus according to some example embodiments of the present inventive concepts.

In this description, when a certain component (or region, layer, portion, etc.) is referred to as being "on", "connected to", or "coupled to" other component(s), the certain component may be directly disposed on, directly connected to, or directly coupled to the other component(s) or at least one intervening component may be present therebetween.

In the specification and drawings, like numerals may indicate like or corresponding components. Moreover, in the drawings, thicknesses, ratios, and dimensions of components may be exaggerated for effectively explaining the technical contents.

It will be understood that, although the terms first, second, etc. may be used herein to describe various components, these components should not be limited by these terms. These terms are only used to distinguish one component from another component. For example, a first component could be termed a second component, and vice versa without departing from the scope of the present invention. Unless the context clearly indicates otherwise, the singular forms are intended to include the plural forms as well.

In addition, the terms "beneath", "lower", "above", "upper", and the like are used herein to describe one component's relationship to other component(s) illustrated in the drawings. The relative terms are intended to encompass different orientations in addition to the orientation depicted in the drawings.

It should be understood that the terms "comprise", "include", "have", and the like are used to specify the presence of stated features, integers, steps, operations, components, elements, or combinations thereof, but do not preclude the presence or addition of one or more other features, integers, steps, operations, components, elements, or combinations thereof. In contrast, the phrase "consisting of" is intended to preclude the presence or addition of one or more other features, integers, steps, operations, components, elements, or combinations thereof.

The present inventive concepts will now be described below with reference to the accompanying drawings.

Figure 1B:
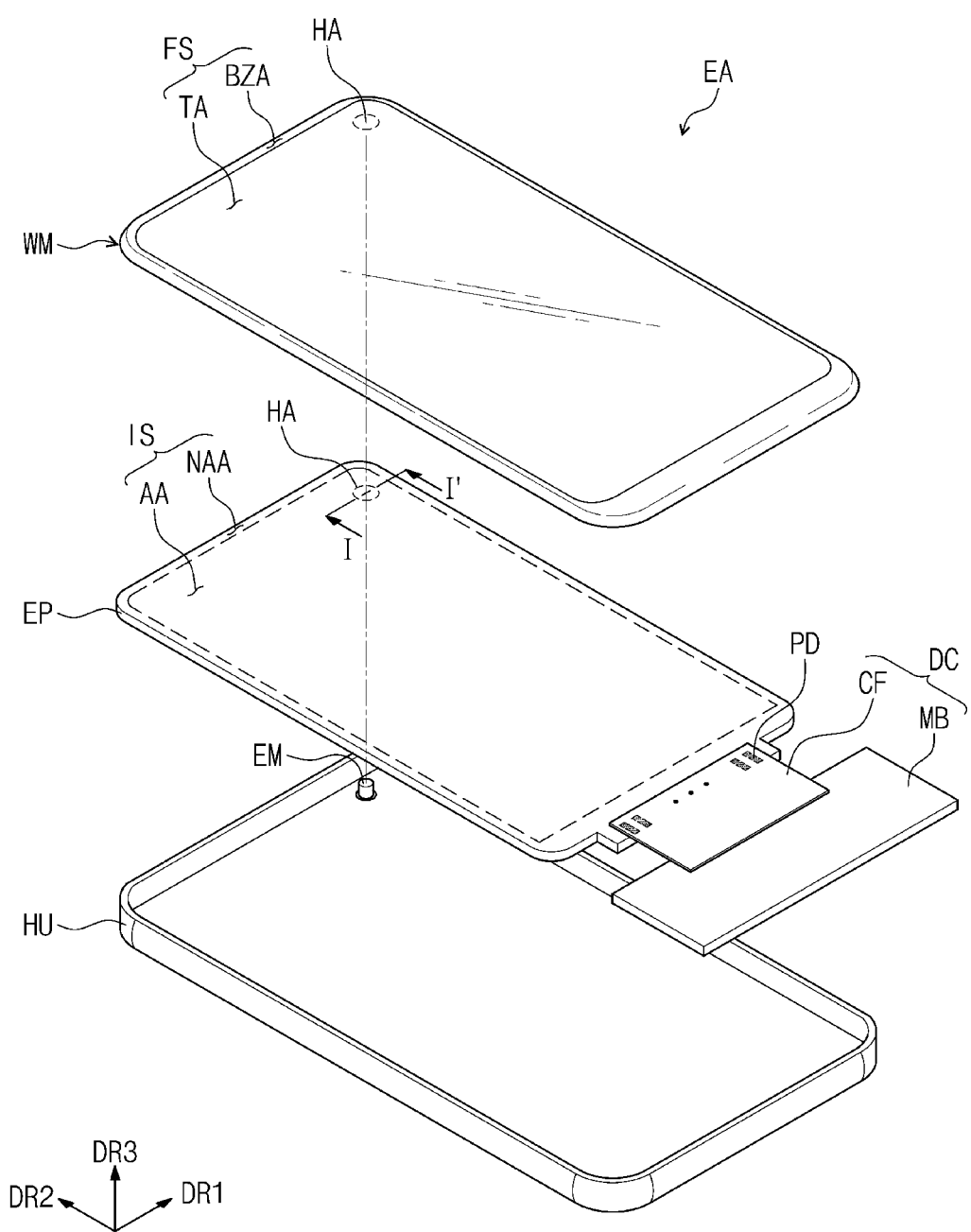
FIG. 1B is an exploded perspective view illustrating the electronic apparatus of FIG. 1A.
Figure 2:
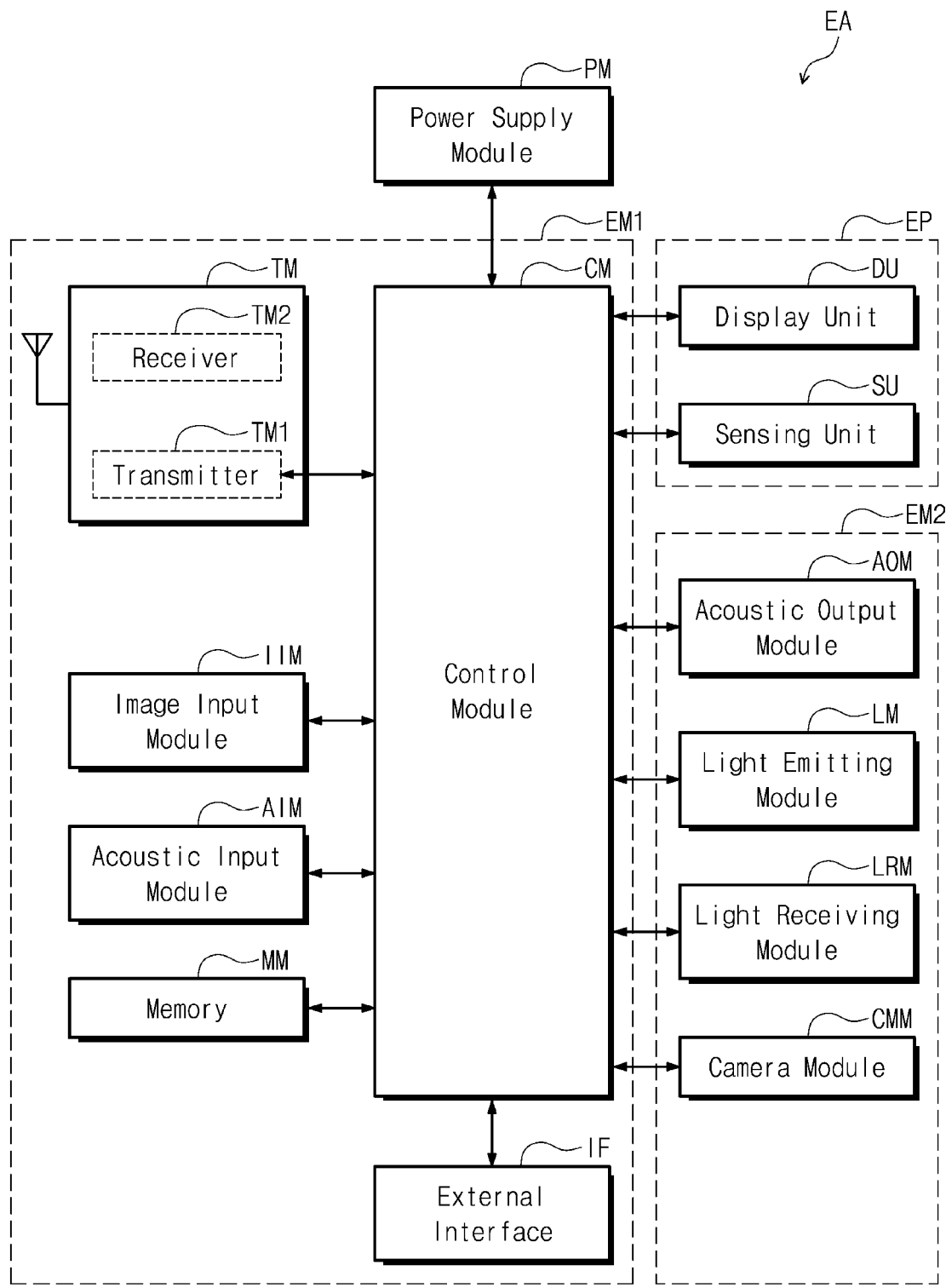
FIG. 2 is a block diagram illustrating an electronic apparatus according to some example embodiments of the present inventive concepts.

FIG. 1A is an assembled perspective view illustrating an electronic apparatus according to some example embodiments of the present inventive concepts. FIG. 1B is an exploded perspective view illustrating the electronic apparatus of FIG. 1A. FIG. 2 is a block diagram illustrating an electronic apparatus according to some example embodiments of the present inventive concepts. The present inventive concepts will be explained below with reference to FIGS. 1A, 1B, and 2.

An electronic apparatus EA may be activated by electrical signals. The electronic apparatus EA may be variously embodied. For example, the electronic apparatus EA may include a tablet computer, a laptop computer, a desktop computer, a smart television set, or the like. In an embodiment, a smart phone is illustrated as an example of the electronic apparatus EA.

As shown in FIG. 1A, the electronic apparatus EA may display an image IM on a front surface FS thereof. The front surface FS may be defined by a plane of a first directional axis DR1 and a second directional axis DR2. The front surface FS includes a transmission region TA, configured to transmit light therethrough, and a bezel region BZA adjacent to the transmission region TA. The bezel region BZA may be configured to block light.

The electronic apparatus EA displays the image IM on the transmission region TA. The image IM may be a static image and/or a dynamic image. FIG. 1A shows a clock and a plurality of icons as examples of the image IM.

The transmission region TA may have a substantially rectangular shape that extends along the first and second directional axes DR1 and DR2. This, however, is exemplarily illustrated, and the shape of the transmission region TA is not necessarily limited to a particular embodiment, but may have various shapes.

The bezel region BZA is adjacent to the transmission region TA. The bezel region BZA may at least partially surround the transmission region TA. This, however, is exemplarily illustrated, and the bezel region BZA may be disposed adjacent to only one side of the transmission region TA or may be omitted entirely. The electronic apparatus EA, according to an embodiment of the present inventive concepts, is not necessarily limited to a particular embodiment, but may include various embodiments.

A normal direction of the front surface FS may correspond to a thickness direction of the electronic apparatus EA, and the thickness direction may correspond to a third directional axis DR3. In the present embodiment, front and rear surfaces (e.g. top and bottom surfaces) of each component are defined based on a direction along which the image IM is displayed. The front and rear surfaces are opposite to each other in the third directional axis DR3.

Directions indicated by the first, second, and third directional axes DR1, DR2, and DR3 are relative concepts and may denote other directions. First, second, and third directions are defined herein to refer to directions respectively indicated by the first, second, and third directional axes DR1, DR2, and DR3, and are allocated the same reference symbols thereto.

The electronic apparatus EA, according to the present inventive concepts, may sense a user's input TC that is externally applied to the electronic apparatus EA. The user's input TC may include a touch of a user's body, light, heat, pressure, or various other types of inputs. In addition, the electronic apparatus EA may sense not only inputs in contact with the electronic apparatus EA, but inputs in close vicinity or adjacent to the electronic apparatus EA.

In the present embodiment, the user's input TC is illustrated as a user's hand applied to the front surface FS. This, however, is exemplarily illustrated, and the user's input TC may be provided in various types as discussed above. Depending on a structure of the electronic apparatus EA, the electronic apparatus EA may sense the user's input TC that is applied to a lateral or rear surface thereof, but the present inventive concepts are not necessarily limited thereto.

The electronic apparatus EA may include a window WM, an electronic panel EP, a circuit board DC, an electronic module EM, and an external casing HU (e.g. housing unit). The window WM and the external casing HU are combined to define an outer appearance of the electronic apparatus EA.

The window WM is disposed on the electronic panel EP and the window WM covers a front surface IS of the electronic panel EP. The window WM may include an optically transparent insulation material. For example, the window WM may include glass or plastic. The window WM may have a multi-layered or single-layered structure. For example, the window WM may have either a stack structure in which a plurality of plastic films that are coupled through an adhesive or a stack structure in which a glass substrate is coupled through an adhesive to a plastic film.

The window WM includes a front surface FS that is externally exposed. The front surface of the electronic apparatus EA may be defined by the front surface FS of the window WM.

For example, the transmission region TA may be an optically transparent area. The transmission region TA may have a shape that corresponds to that of an active region AA. For example, the transmissive region TA overlaps an entire surface of the active region AA or at least a portion of the active region AA. The image IM displayed on the active region AA of the electronic panel EP may be viewed through the transmission region TA.

The bezel region BZA may be an area whose transmittance of visible light is relatively less than that of the transmission region TA. The bezel region BZA defines a shape of the transmission region TA. The bezel region BZA may be adjacent to and may at least partially surround the transmission region TA.

The bezel region BZA may have a certain color. When the window WM is provided as a glass or plastic substrate, the bezel region BZA is a colored layer printed or deposited on one surface of the glass or plastic substrate. Alternatively, the bezel region BZA may be formed by coloring a related area of the glass or plastic substrate.

The bezel region BZA may at least partially cover a peripheral region NAA of the electronic panel EP and may inhibit the peripheral region NAA from being visible. This, however, is exemplarily illustrated, and the bezel region BZA may be omitted from the window WM according to an embodiment of the present inventive concepts.

The electronic panel EP may display the image IM and detect the user's input TC. The electronic panel EP has a front surface IS including the active region AA and the peripheral region NAA. The active region AA may be an area that is activated in accordance with electrical signals.

In the present embodiment, the active region AA may be an area on which the image IM is displayed and also in which the user's input TC is detected. The transmission region TA overlaps at least a portion of the active region AA. Accordingly, a user may recognize the image IM through the transmission region TA, or may provide the user's input TC through the transmission region TA. This, however, is exemplarily illustrated. The active region AA may be configured such that an area to display the image IM is separated from an area to detect the user's input TC, but the present inventive concepts are not necessarily limited thereto.

The peripheral region NAA may be an area covered with the bezel region BZA. The peripheral region NAA is adjacent to the active region AA. The peripheral region NAA may at least partially surround the active region AA. The peripheral region NAA may include driving lines or driving circuits that drive the active region AA.

The peripheral region NAA may include pads PD, one or more electronic elements, or various signal lines that provide the active region AA with electrical signals. The peripheral region NAA may be covered with the bezel region BZA and thus might not be visible.

In the present embodiment, the electronic panel EP is assembled in a flat state in which the active region AA and the peripheral region NAA are each oriented toward the window WM. This, however, is exemplarily illustrated, and the peripheral region NAA of the electronic panel EP may be partially bent. In this case, a portion of the peripheral region NAA may be bent toward the rear surface of the electronic apparatus EA, and thus the bezel region BZA may decrease in area on the front surface FS of the electronic apparatus EA. Alternatively, the electronic panel EP may be assembled in a state in which a portion of the active region AA is also bent. Alternatively, the peripheral region NAA may be omitted from the electronic panel EP according to an embodiment of the present inventive concepts.

Referring to FIGS. 1A, 1B and 2, the electronic panel EP may include a display unit DU and a sensing unit SU. The display unit DU may be a component that substantially generates the image IM. The image IM generated from the display unit DU may be visible to users through the transmission region TA.

The sensing unit SU detects the user's input TC that has been externally applied. As discussed above, the sensing unit SU may detect the user's input TC provided to the window WM.

A high-transmission region HA (or, a first region) may be defined on the electronic panel EP. Compared to the active region AA (or, a second region), the high-transmission region HA may have a higher transmittance of visible light per unit area. For example, the high-transmission region HA may have the highest transmittance of visible light at its central portion that serves as a pathway of light that the electronic module EM receives. A detailed description thereof will be further provided below.

The high-transmission region HA is defined at a location where, when in a plan view, the high-transmission region HA at least partially overlaps the electronic module EM, which will be discussed below. The high-transmission region HA may be an area that at least partially overlaps, not only a light-receiving or light-output portion of the electronic module EM, but a main part, such as a body or housing, that constitutes the electronic module EM.

The high-transmission region HA may have various shapes. In the present embodiment, although the high-transmission region HA is illustrated as having a circular shape for simplification of description, the high-transmission region HA may have various shapes such as an elliptical shape, a polygonal shape, or any other shape including curved and/or straight sides.

At least a portion of the high-transmission region HA may be surrounded by the active region AA. In the present embodiment, the high-transmission region HA is spaced apart from the peripheral region NAA (or, a third region). The high-transmission region HA is illustrated as being defined in the active region AA such that an overall edge of the high-transmission region HA is surrounded by the active region AA. In an assembled state of the electronic apparatus EA, according to the present embodiment, the high-transmission region HA may be defined at a location that at least partially overlaps the transmission region TA and is spaced apart from the bezel region BZA.

The circuit board DC may be connected to the electronic panel EP. The circuit board DC may include a flexible board CF and a main board MB. The flexible board CF may include an insulation film and conductive connection lines mounted on the insulation film. The conductive connection lines are coupled to the pads PD and electrically connect the circuit board DC to the electronic panel EP.

In the present embodiment, the flexible board CF may be assembled in a bent state. Therefore, the main board MB may be disposed on a rear surface of the electronic panel EP and may be stably accommodated in a space of the external casing HU. In the present embodiment, the flexible board CF may be omitted, and in this case, the main board MB may be directly coupled to the electronic panel EP.

The main board MB may include signal lines and electronic elements. The electronic elements may be coupled to the signal lines to come into electrical connection with the electronic panel EP. The electronic elements generate various electrical signals, such as signals for producing the image IM and/or for detecting the user's input TC, and/or process detected signals. The main board MB may be provided in plural corresponding to electrical signals for generating and processing, but the present inventive concepts are not necessarily limited thereto.

For the electronic apparatus EA, according to an embodiment of the present inventive concepts, a driving circuit that provides electrical signals to the active region AA may be directly mounted on the electronic panel EP. In this case, the driving circuit may be mounted in the form of a chip or may be formed together with pixels (see PX of FIG. 3A). Thus, the circuit board DC may have a reduced area or may be omitted. The electronic apparatus EA, according to the present inventive concepts, is not necessarily limited to a particular embodiment, but may include various embodiments.

The electronic module EM is disposed below the window WM. When in a plan view, the electronic module EM may at least partially overlap the high-transmission region HA. The electronic module EM may receive the user's input TC transferred through the high-transmission region HA or may provide an output through the high-transmission region HA. According to the present inventive concepts, the electronic module EM may be disposed to at least partially overlap the active region AA, and thus may prevent an increase in area of the bezel region BZA.

Referring back to FIG. 2, the electronic apparatus EA may include the electronic panel EP, a power supply module PM, a first electronic module EM1, and a second electronic module EM2. The electronic panel EP, the power supply module PM, the first electronic module EM1, and the second electronic module EM2 may be electrically connected to each other. FIG. 2 exemplarily shows the display unit DU and the sensing unit SU among components of the electronic panel EP.

The first electronic module EM1 and the second electronic module EM2 may each include diverse functional modules to operate the electronic apparatus EA. The first electronic module EM1 may be directly mounted on a motherboard electrically connected to the electronic panel EP, or may be mounted on a separate board electrically connected to the motherboard through connectors or the like.

The first electronic module EM1 may include a control module CM, a wireless communication module TM, an image input module IIM, an acoustic input module AIM, a memory MM, and an external interface IF. One or more of the modules mentioned above might not be mounted on the motherboard, but may instead be electrically connected through a flexible circuit board to the motherboard.

The control module CM controls an overall operation of the electronic apparatus EA. The control module CM may be a microprocessor. For example, the control module CM may activate or deactivate the electronic panel EP. Based on touch signals received from the electronic panel EP, the control module CM may control other modules, such as the image input module IIM or the acoustic input module AIM.

The wireless communication module TM may use Bluetooth or WiFi communication to communicate wirelessly with other terminals. The wireless communication module TM may use a general communication system to send and receive speech signals. The wireless communication module TM may include a transmitter TM1 that modulates and transmits signals to be transferred, and also include a receiver TM2 that demodulates received signals.

The image input module IIM processes and converts image signals into image data that are capable of being displayed on the electronic panel EP. The acoustic input module AIM receives external sound signals through a microphone in record mode or speech recognition mode, and converts the received sound signals into electrical voice data.

The external interface IF serves as an interface connected to an external charger, a wire/wireless data port, a card socket (e.g., memory card, SIM/UIM card).

The second electronic module EM2 may include an acoustic output module AOM, a light-emitting module LM, a light-receiving module LRM, and a camera module CMM. The components mentioned above may be directly mounted on the motherboard, may be mounted on a separate board and electrically connected through connectors or the like to the electronic panel EP, or may be electrically connected to the first electronic module EM1.

The acoustic output module AOM converts and outputs sound data that are received from the wireless communication module TM or are stored in the memory MM.

The light-emitting module LM generates and outputs light. The light-emitting module LM may output infrared light. For example, the light-emitting module LM may include an LED element. The light-receiving module LRM may detect infrared light. The light-receiving module LRM may be activated when detecting infrared light at a certain level or higher. The light-receiving module LRM may include a CMOS sensor. After the output of the infrared light generated from the light-emitting module LM, the infrared light may be reflected from an external substance (e.g., user's fingers or face), and then the light-receiving module LRM may receive the reflected infrared light. The camera module CMM captures an external image.

The electronic module EM, according to an embodiment of the present inventive concepts, may include one or more of the first electronic module EM1 and the second electronic module EM2. For example, the electronic module EM may include one or more of a camera, a speaker, an optical sensor, and/or a thermal sensor. The electronic module EM may detect an external object received through the high-transmission region HA or may externally provide sound signals, such as voices, through the high-transmission region HA. In addition, the electronic module EM may include a plurality of components, but the present inventive concepts are not necessarily limited thereto.

The electronic module EM overlapping the high-transmission region HA may easily recognize an external object through the high-transmission region HA, or output signals generated from the electronic module EM may be easily transferred to the outside. The electronic apparatus EA, according to an embodiment of the present inventive concepts, may further include a transparent member that is disposed between the electronic module EM and the electronic panel EP. The transparent member may be an optically transparent film to allow the user's input TC, which is transferred through the high-transmission region HA, to pass through the transparent member and to enter the electronic module EM. The transparent member may be attached to the rear surface of the electronic panel EP, or may be disposed between the electronic panel EP and the electronic module EM without a separate adhesive layer disposed therebetween. The electronic apparatus EA, according to an embodiment of the present inventive concepts, may have various structures, but the present inventive concepts are not necessarily limited thereto.

According to the present inventive concepts, when in a plan view, the electronic module EM may be assembled to at least partially overlap the transmission region TA. Accordingly, an area of the bezel region BZA may be prevented from increasing due to accommodation of the electronic module EM, which may result in an preferred design.

Figure 3A:
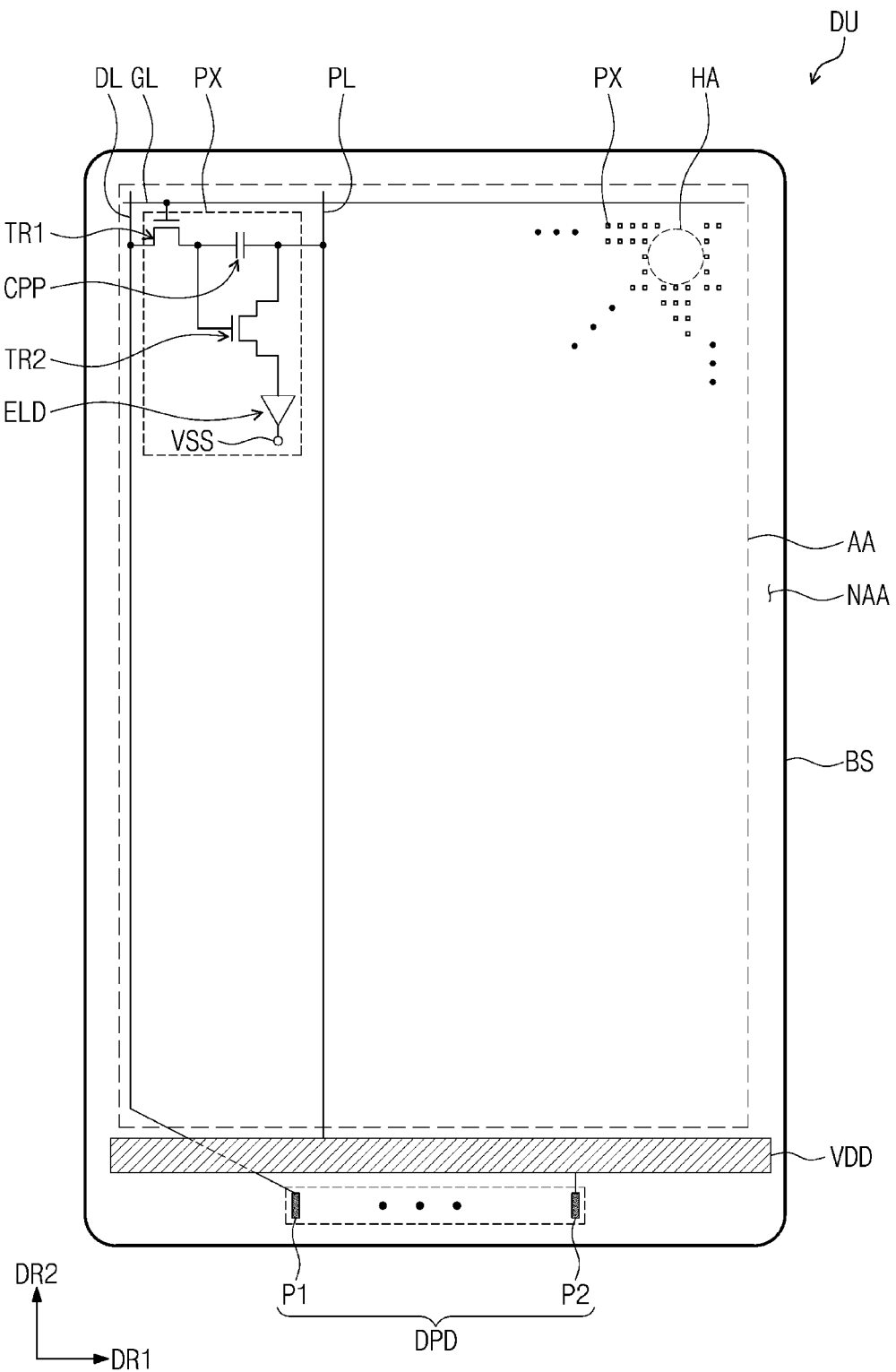
FIG. 3A is a plan view illustrating a display unit according to some example embodiments of the present inventive concepts.
Figure 3B:
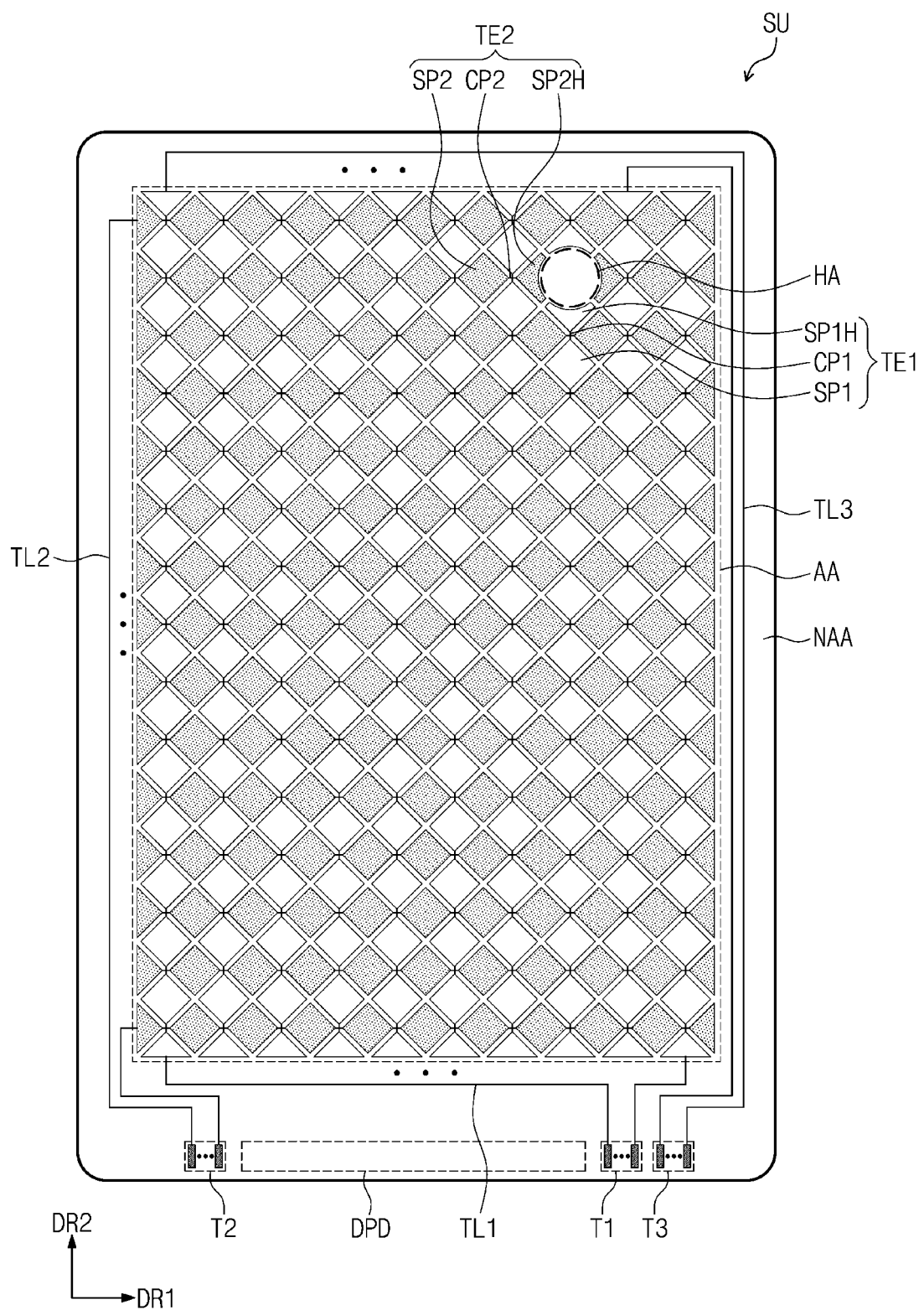
FIG. 3B is a plan view illustrating a sensing unit according to some example embodiments of the present inventive concepts.

FIG. 3A illustrates a plan view showing a display unit according to some example embodiments of the present inventive concepts. FIG. 3B illustrates a plan view showing a sensing unit according to some example embodiments of the present inventive concepts. The present inventive concepts will be described below with reference to FIGS. 3A and 3B. The same components as those discussed with reference to FIGS. 1A, 1B, and 2 are allocated the same reference symbols thereto, and a repetitive explanation will be omitted. It is to be understood that to the extent that certain details are not provided, these details may be at least similar to those details provided elsewhere in the specification for corresponding elements.

As shown in FIG. 3A, the display unit DU includes a base substrate BS, a plurality of pixels PX, a plurality of signal lines GL, DL, and PL, a power pattern VDD, and a plurality of display pads DPD.

The active region AA and the peripheral region NAA may be areas provided on the base substrate BS. The base substrate BS may include an insulation substrate. For example, the base substrate BS may be formed of a glass substrate, a plastic substrate, or a combination thereof.

Alternatively, the base substrate BS may include a metal substrate. The base substrate BS may be flexible to allow a user to fold the base substrate BS, or may be rigid. The base substrate BS, according to the present inventive concepts, is not necessarily limited to a particular embodiment, but may include various embodiments as long as the base substrate BS is configured appropriately to place thereon components such as the pixels PX or the signal lines GL, DL, and PL.

The signal lines GL, DL, and PL are connected to the pixels PX and transfer electrical signals to the pixels PX. A scan line GL, a data line DL, and a power line PL are exemplarily shown among signal lines included in the display unit DU. This, however, is exemplarily illustrated. The signal lines GL, DL, and PL may further include one or more of an initialization voltage line, and/or an emission control line, but the present inventive concepts are not necessarily limited thereto.

The pixels PX may be disposed on the active region AA. In the present embodiment, there is illustrated an example of a signal circuit for one of the plurality of pixels PX. The pixel PX may include a first thin film transistor TR1, a capacitor CPP, a second thin film transistor TR2, and a light emitting element ELD.

The first thin film transistor TR1 is connected to the scan line GL and the data line DL. The capacitor CPP is connected to the first thin film transistor TR1 and the power line PL. The second thin film transistor TR2 is connected to the first thin film transistor TR1, the capacitor CPP, and the light emitting element ELD. The first thin film transistor TR1, the capacitor CPP, and the second thin film transistor TR2 may control an operation of the light emitting element ELD.

The light emitting element ELD may emit light at magnitude for a time period, which magnitude and time period correspond to a data signal transferred through the data line DL. For example, the light emitting element ELD may include an organic light emitting device, a quantum dot light emitting device, an electrophoresis device, or an electro-wetting device.

The light emitting element ELD is connected to a power terminal VSS and receives a power signal (referred to herein as a second power signal) different from a power signal (referred to herein as a first power signal) provided from the power line PL. The light emitting element ELD may generate light that corresponds to a difference between the second power signal and an electrical signal that is provided from the second thin film transistor TR2. This, however, is exemplarily illustrated. Each of the plurality of pixels PX may include electronic elements having various configurations and arrangements, but the present inventive concepts are not necessarily limited thereto.

The pixels PX are disposed around the high-transmission region HA. In the present embodiment, a boundary between the high-transmission region HA and the active region AA may have a closed line shape. In the present embodiment, the boundary between the high-transmission region HA and the active region AA is exemplarily illustrated as having a circular shape.

The power pattern VDD is disposed on the peripheral region NAA. In the present embodiment, the power pattern VDD is coupled to a plurality of power lines PL. Because the display unit DU includes the power pattern VDD, the pixels PX may be provided with the same first power signal.

The display pads DPD may include a first pad P1 and a second pad P2. The first pad P1 may be provided in plural, and the plurality of first pads P1 may be connected to corresponding data lines DL. The second pad P2 may be coupled to the power pattern VDD and thus may be electrically connected to the power line PL. The display unit DU may provide the pixels PX with electrical signals that are externally provided through the display pads DPD. The display pads DPD may further include, besides the first pad P1 and the second pad P2, other pads for receiving electrical signals, but the present inventive concepts are not necessarily limited thereto.

Referring to FIG. 3B, the sensing unit SU is illustrated as having a shape that corresponds to that of the display unit DU. In the present embodiment, the sensing unit SU may be disposed on the display unit DU. This, however, is exemplarily illustrated. The sensing unit SU may be disposed below the display unit DU or embedded in the display unit DU, but the position of the sensing unit SU is not necessarily limited to a particular embodiment.

The sensing unit SU may detect the user's input (see TC of FIG. 1A) to obtain information about position or intensity of the external input TC. The sensing unit SU includes a plurality of first sensing electrodes TE1, a plurality of second sensing electrodes TE2, a plurality of lines TL1, TL2, and TL3, and a plurality of sensing pads T1, T2, and T3.

The first sensing electrodes TE1 and the second sensing electrodes TE2 are disposed on the active region AA. The sensing unit SU may obtain information about the user's input TC, based on a variation in capacitance between the first sensing electrodes TE1 and the second sensing electrodes TE2.

The first sensing electrodes TE1 are arranged along the first direction DR1, and each of the first sensing electrodes TE1 extends along the second direction DR2. Each of the first sensing electrodes TE1 may include a first main pattern SP1, a first adjacent pattern SP1H, and a first connection pattern CP1.

The first main pattern SP1 is disposed on the active region AA. The first main pattern SP1 is spaced apart from the high-transmission region HA. The first main pattern SP1 has a certain shape and a first area. In the present embodiment, the first main pattern SP1 may have a rhombic shape. This, however, is exemplarily illustrated. The first main pattern SP1 may have various shapes, and the shape thereof is not necessarily limited to a particular embodiment.

The first adjacent pattern SP1 His disposed adjacent to the high-transmission region HA. The sensing unit SU, according to the present embodiment, may be removed at its portion that overlaps the high-transmission region HA. The first adjacent pattern SP1H has a second area that is less than the first area of the first main pattern SP1. The first adjacent pattern SP1H may have a shape that is obtained by removing an overlapping portion with the high-transmission region HA from a rhombic shape, which may be the same as that of the first main pattern SP1.

In the present embodiment, the first connection pattern CP1 extends along the second direction DR2. The first connection pattern CP1 is connected to the first main pattern SP1. The first connection pattern CP1 may be disposed between and may connect two first main patterns SP1. Alternatively, the first connection pattern CP1 is disposed between and connects the first main pattern SP1 and the first adjacent pattern SP1H.

The second sensing electrodes TE2 are arranged along the second direction DR2, and each of the second sensing electrodes TE2 extends along the first direction DR1. Each of the second sensing electrodes TE2 may include a second main pattern SP2, a second adjacent pattern SP2H, and a second connection pattern CP2.

The second main pattern SP2 is spaced apart from the high-transmission region HA. The second main pattern SP2 may be spaced apart from the first main pattern SP1. In the present embodiment, separation between the first main pattern SP1 and the second main pattern SP2 may be accomplished in a cross-sectional view. The first main pattern SP1 and the second main pattern SP2 may be electrically insulated from each other, and thus may independently send and receive electrical signals.

In the present embodiment, the second main pattern SP2 may have the same shape as that of the first main pattern SP1. For example, the second main pattern SP2 may have a rhombic shape. This, however, is exemplarily illustrated. The second main pattern SP1 may have various shapes, and the shape thereof is not necessarily limited to a particular embodiment.

The second adjacent pattern SP2H is disposed adjacent to the high-transmission region HA. The second adjacent pattern SP2H has an area less than that of the second main pattern SP2. The second adjacent pattern SP2H may have a shape that is obtained by removing an overlapping portion with the high-transmission region HA from a rhombic shape the same as that of the second main pattern SP2.

In the present embodiment, the second connection pattern CP2 extends along the first direction DR1. The second connection pattern CP2 is connected to the second main pattern SP2. The second connection pattern CP2 is disposed between and connects two second main patterns SP2. Alternatively, the second connection pattern CP2 is disposed between and connects the second main pattern SP2 and the second adjacent pattern SP2H.

The sensing lines TL1, TL2, and TL3 are disposed on the peripheral region NAA. The sensing lines TL1, TL2, and TL3 may include first sensing lines TL1, second sensing lines TL2, and third sensing lines TL3.

The first sensing lines TL1 are connected to corresponding first sensing electrodes TE1. In the present embodiment, the first sensing lines TL1 are correspondingly connected to lower ones of opposite ends of the first sensing electrodes TE1.

The second sensing lines TL2 are correspondingly connected to one ends of the second sensing electrodes TE2. In the present embodiment, the second sensing lines TL2 are correspondingly connected to left ones of opposite ends of the second sensing electrodes TE2.

The third sensing lines TL3 are correspondingly connected to upper ones of opposite ends of the first sensing electrodes TE1. According to the present inventive concepts, the first sensing electrodes TE1 are connected to corresponding first sensing lines TL1 and corresponding third sensing lines TL3. Therefore, it may be possible to uniformly maintain sensitivity with respect to the first sensing electrodes TE1 whose lengths are relatively greater than those of the second sensing electrodes TE2. This, however, is exemplarily illustrated. The third sensing lines TL3 may be omitted from the sensing unit SU, according to an embodiment of the present inventive concepts, but the present inventive concepts are not necessarily limited thereto.

The sensing pads T1, T2, and T3 are disposed on the peripheral region NAA. The sensing pads T1, T2, and T3 may include first sensing pads T1, second sensing pads T2, and third sensing pads T3. The first sensing pads T1 are connected to corresponding first sensing lines TL1 and provide the first sensing electrodes TE1 with external signals. The second sensing pads T2 are connected to corresponding second sensing lines TL2, and the third sensing pads T3 are connected to corresponding third sensing lines TL3 and electrically connected to the first sensing electrodes TE1.

According to the present inventive concepts, the high-transmission region HA is provided at a location surrounded by the active region AA, and as a result, an area of the bezel region BZA may be prevented from increasing caused by the electronic module (see EM of FIG. 1B). Furthermore, because the sensing electrodes TE1 and TE2 or the pixels PX disposed adjacent to the high-transmission region HA each have electrical connection via the high-transmission region HA, display characteristics or sensitivity of the active region AA may be prevented from being reduced due to the provision of the high-transmission region HA.

Figure 4A:
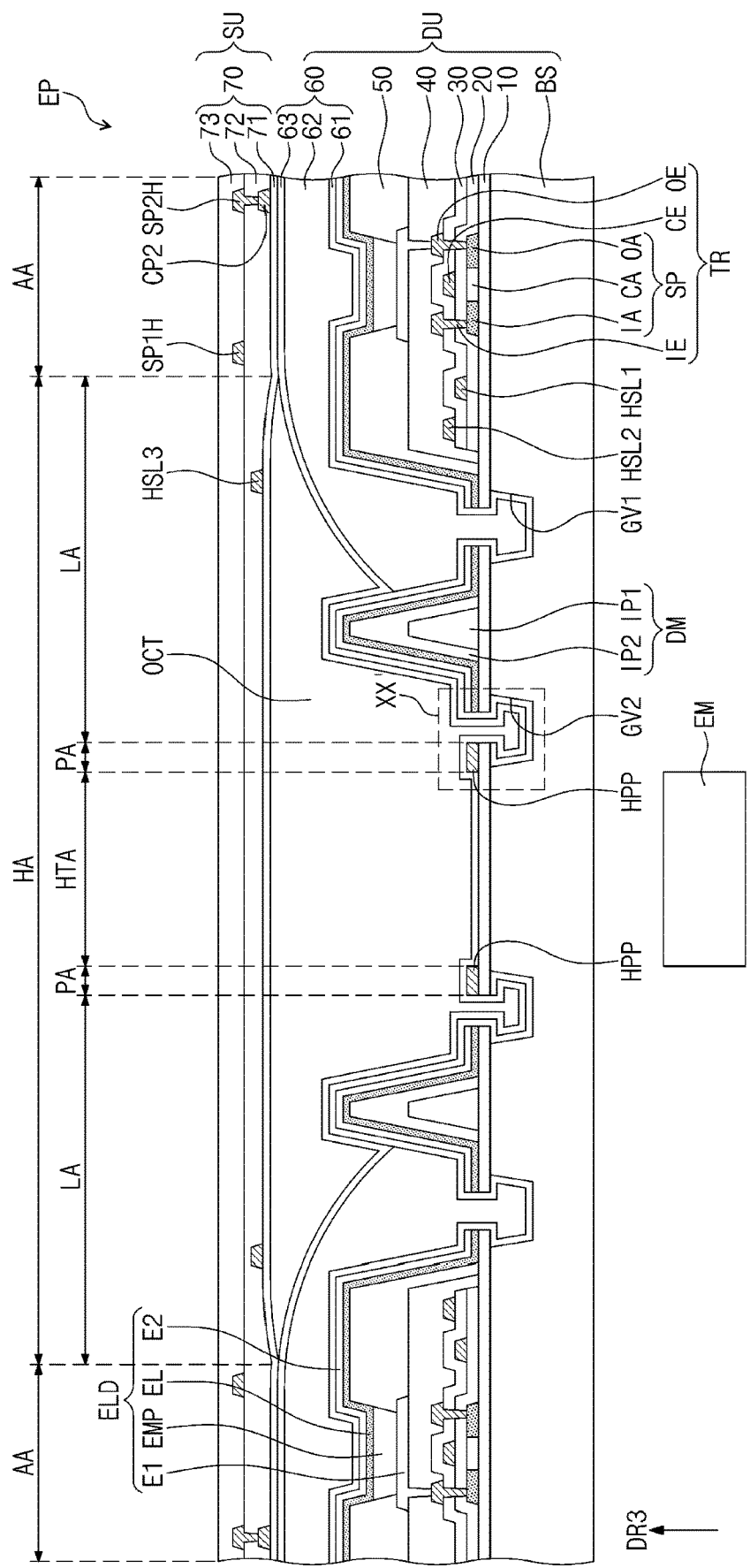
FIG. 4A is a cross-sectional view illustrating an electronic panel taken along line I-I' of FIG. 1B.

FIG. 4A illustrates a cross-sectional view showing an electronic panel taken along line I-I' of FIG. 1B. FIGS. 4B to 4E illustrate plan views partially showing an electronic panel according to some example embodiments of the present inventive concepts. The present inventive concepts will be described below with reference to FIGS. 4A to 4E. The same components as those discussed with reference to FIGS. 1A to 3B are allocated the same reference symbols thereto, and a repetitive explanation will be omitted. It is to be understood that to the extent that certain details are not provided, these details may be at least similar to those details provided elsewhere in the specification for corresponding elements.

FIG. 4A exemplarily shows a base substrate BS, a thin film transistor TR, a light emitting element ELD, plurality of insulation layers 10, 20, 30, 40, 50, 60, and 70, a plurality of adjacent patterns SP1H and SP2H, a connection pattern CP2, and hole signal lines HSL1, HSL2, and HSL3, which are selected from components of the electronic panel EP for simplification of description.

The insulation layers 10 to 70 may include first, second, third, fourth, fifth, sixth, and seventh insulation layers 10, 20, 30, 40, 50, 60, and 70 that are sequentially stacked. Each of the first to seventh insulation layers 10 to 70 may include one or more of an organic material and/or inorganic material, and/or may have a single-layered or multi-layered structure.

In the present embodiment, the base substrate BS may be optically transparent. For example, the base substrate BS may have a visible light transmittance equal to or greater than about 90%.

The first insulation layer 10 is disposed on the base substrate BS and at least partially covers a front surface of the base substrate BS. The first insulation layer 10 may include one or more of a barrier layer and a buffer layer. Therefore, the first insulation layer 10 may prevent the pixel (see PX of FIG. 3A) from receiving oxygen or moisture that is introduced through the base substrate BS, or may have a low surface energy to stably form the pixel PX on the base substrate BS.

In the present embodiment, the first insulation layer 10 may be optically transparent. For example, the first insulation layer 10 may have a visible light transmittance equal to or greater than about 90%.

The thin film transistor TR and the light emitting element ELD constitute the pixel (see PX of FIG. 3A). The thin film transistor TR may correspond to the second thin film transistor (see TR2 of FIG. 3A) of the pixel PX.

The thin film transistor TR may include a semiconductor pattern SP, a control electrode CE, an input electrode IE, and an output electrode OE. The semiconductor pattern SP is disposed on the first insulation layer 10.

The semiconductor pattern SP includes a semiconductor material. For example, the semiconductor pattern SP may include a III-group element, a V-group element, a compound of the III-group or V-group element, or an oxide semiconductor.

The semiconductor pattern SP may be divided into a channel region CA, an input region IA, and an output region OA that is spaced apart from the input region IA across the channel region CA. The channel region CA, the input region IA, and the output region OA are connected to each other to have a single unitary shape.

When viewed in plan, the channel region CA may be an area that at least partially overlaps the control electrode CE. The input region IA and the output region OA may have charge mobility relatively greater than that of the channel region CA. Charge in the semiconductor pattern SP may move from the input region IA through the channel region CA to the output region OA.

The control electrode CE is disposed on the second insulation layer 20. The second insulation layer 20 is disposed on the first insulation layer 10 and covers the semiconductor pattern SP. When viewed in cross-section, the control electrode CE may be spaced apart from the semiconductor pattern SP across the second insulation layer 20.

The input electrode IE and the output electrode OE are disposed on the third insulation layer 30. The third insulation layer 30 is disposed on the second insulation layer 20 and at least partially covers the control electrode CE.

The input electrode IE penetrates the second and third insulation layers 20 and 30 and is coupled to the input region IA. The output electrode OE is spaced apart from the input electrode IE and is coupled to the output region OA. Each of the input and output electrodes IE and OE may include a conductive material. The input electrode IE provides the input region 1A with charge, and the output electrode OE transfers, to the light emitting element ELD, charge that is moved to the output region OA.

The input electrode IE and the output electrode OE may be omitted from the thin film transistor TR according to the present embodiment. For example, the thin film transistor TR may be formed only of the control electrode CE and the semiconductor pattern SP. In this case, the input region IA and the output region OA may serve as the input electrode IE and the output electrode OE, and the input electrode IE and the output electrode OE may act as connection electrodes that connect the thin film transistor TR to other signal lines or other elements. The thin film transistor TR, according to an embodiment of the present inventive concepts, may be provided in various structures, but the present inventive concepts are not necessarily limited thereto.

The light emitting element ELD may include a first electrode E1, a second electrode E2, an emission pattern EMP, and a control layer EL. The first electrode E1 is disposed on the fourth insulation layer 40. The fourth insulation layer 40 is disposed on the third insulation layer 30 and covers the thin film transistor TR. The first electrode E1 is coupled to the output electrode OE and is electrically connected to the thin film transistor TR.

The second electrode E2 is disposed on the fifth insulation layer 50 placed on the fourth insulation layer 40. The fifth insulation layer 50 may include one or more of an organic material and/or an inorganic material, and may have a single-layered or multi-layered structure.

The second electrode E2 may have an area that covers at least an entire surface of the active region AA. Therefore, a plurality of light emitting elements ELD may commonly include a single second electrode E2. This, however, is exemplarily illustrated. The second electrode E2 may be provided to each pixel PX and thus a plurality of second electrodes E2 may correspond to a plurality of first electrode E1, but the present inventive concepts are not necessarily limited thereto.

The fifth insulation layer 50 may have an opening that is defined to expose at least a portion of the first electrode E1. The emission pattern EMP may be disposed in the opening. The emission pattern EMP may include a luminous material consisting of a fluorescent or phosphorescent material. The luminous material may include an organic luminous material or an inorganic luminous material, but the present inventive concepts are not necessarily limited thereto.

The control layer EL is disposed between the first electrode E1 and the second electrode E2. The control layer EL may have an area that covers at least the entire surface of the active region AA. The control layer EL may include an organic material. The control layer EL controls movement of charge and thus the light emitting element ELD increases in luminous efficiency and lifespan. The control layer EL may include an electron transport material, an electron injection material, a hole transport material, or a hole injection material.

In the present embodiment, the control layer EL is illustrated as being disposed on the emission pattern EMP, but this configuration is an exemplary embodiment. The control layer EL, according to an embodiment of the present inventive concepts, may be disposed between the emission pattern EMP and the first electrode E1, or may be provided in plural between the emission pattern EMP and the first electrode E1 and between the emission pattern EMP and the second electrode E2, but the present inventive concepts are not necessarily limited thereto.

The sixth insulation layer 60 is disposed on and encapsulates the light emitting element ELD. In the present embodiment, the sixth insulation layer 60 may be an encapsulation layer. The second electrode E2 and the sixth insulation layer 60 may further be provided therebetween with a capping layer that covers the second electrode E2.

The sixth insulation layer 60 may include a first inorganic layer 61, an organic layer 62, and a second inorganic layer 63 that are sequentially stacked along the third direction DR3. This, however, is not necessarily limited thereto, and the sixth insulation layer 60 may further include a plurality of inorganic layers and a plurality of organic layers.

The first inorganic layer 61 may cover the second electrode E2. The first inorganic layer 61 may prevent the light emitting element ELD from receiving external moisture or oxygen. For example, the first inorganic layer 61 may include silicon nitride, silicon oxide, or a compound including any combination thereof. The first inorganic layer 61 may be formed by a chemical vapor deposition process.

The first inorganic layer 61 may have a transmittance of visible light that is less than that of the base substrate BS. For example, the first inorganic layer 61 may include silicon nitride (SiNx). A detailed description thereof will be further discussed below.

The organic layer 62 may be disposed on and in contact with the first inorganic layer 61. The organic layer 62 may provide the first inorganic layer 61 with a flat surface. The organic layer 62 covers uneven portions formed on or particles present on a top surface of the first inorganic layer 61, with the result that a state of the top surface of the first inorganic layer 61 might not be allowed to affect components formed on the organic layer 62. In addition, the organic layer 62 may relieve stress between layers that are in contact with it. The organic layer 62 may include an organic material, and may be formed by a solution process such as spin coating, slit coating, or inkjet coating.

The second inorganic layer 63 is disposed on and covers the organic layer 62. The second inorganic layer 63 may be relatively more stably formed on a flat surface than on the first inorganic layer 61. The second inorganic layer 63 encapsulates moisture or the like released from the organic layer 62 and prevents outward movement of the moisture or the like.

The second inorganic layer 63 may be optically transparent. For example, the second inorganic layer 63 may have a visible light transmittance equal to or greater than about 90%. The second inorganic layer 63 may have a transmittance of visible light relatively greater than that of the first inorganic layer 61. The second inorganic layer 63 may include silicon oxide (SiOx) or silicon oxynitride (SiON).

The second inorganic layer 63 may be formed by a chemical vapor deposition process. Each of the first inorganic layer 61, the organic layer 62, and the second inorganic layer 63 may include a plurality of layers, but the present inventive concepts are not necessarily limited thereto.

In the present embodiment, an example is exemplarily illustrated in which the sensing unit SU is disposed on the display unit DU. As discussed above, the first adjacent pattern SP1H, the second adjacent pattern SP2H, and the second connection pattern CP2 may be ones of components included in the sensing unit SU. The sensing unit SU may be constituted by the first adjacent pattern SP1H, the second adjacent pattern SP2H, the second connection pattern CP2, and the seventh insulation layer 70.

The seventh insulation layer 70 may include first, second, and third sensing insulation layers 71, 72, and 73 that are sequentially stacked. The seventh insulation layer 70 may be provided to at least partially overlap the active region AA and the high-transmission region HA.

Each of the first, second, and third sensing insulation layers 71, 72, and 73 may be optically transparent. For example, each of the first, second, and third sensing insulation layers 71, 72, and 73 may have a visible light transmittance equal to or greater than about 90%. Each of the first, second, and third sensing insulation layers 71, 72, and 73 may have an inorganic layer, an organic layer, or a stack structure there of inorganic and/or organic layers.

In the present embodiment, it is illustrated that the first adjacent pattern SP1H and the second adjacent pattern SP2H are disposed on the same layer, and the second connection pattern CP2 is disposed on a different layer from that on which the second adjacent pattern SP2H is disposed. The second connection pattern CP2 may be disposed between the first sensing insulation layer 71 and the second sensing insulation layer 72, and the second adjacent pattern SP2H may penetrate the second sensing insulation layer 72 and may be coupled to the second connection pattern CP2. The second connection pattern CP2 connects the second adjacent pattern SP2H to the second main pattern (see SP2 of FIG. 3B). The first connection pattern CP1 may be disposed on the same layer as that on which the first main pattern SP1 is disposed, and thus may be directly connected to the first main pattern SP1.

This, however, is exemplarily illustrated. The second connection pattern CP2 may be disposed on the same layer as that on which the second adjacent pattern SP2H is disposed, and the first connection pattern CP1 may be disposed on a different layer from that on which the first adjacent pattern SP1H is disposed. Alternatively, the first sensing electrode (see TE1 of FIG. 3B) and the second sensing electrode (see TE2 of FIG. 3B) may be disposed on different layers from each other. The sensing unit SU, according to an embodiment of the present inventive concepts, may be provided to have various structures, but the present inventive concepts are not necessarily limited thereto.

In the embodiment, each of the first and second adjacent patterns SP1 Hand SP2H includes a plurality of mesh lines, and FIG. 4A shows portions of the mesh lines. This, however, is exemplarily illustrated, and each of the first and second adjacent patterns SP1H and SP2H may include transparent conductive oxide, and in this case, the first adjacent pattern SP1H or the second adjacent pattern SP2H may be provided to have a size which, when viewed in plan, overlaps the emission pattern EMP.

The hole signal lines HSL1, HSL2, and HSL3 are disposed on the high-transmission region HA. The high-transmission region HA may include a central region HTA, a pattern region PA, and a line region LA.

The central region HTA may be an area that substantially overlaps receiving and output parts of the electronic module EM, which receiving part receives an external input and which output part provides an output. For example, when the electronic module EM is a camera module, the central region HTA may be an area that at least partially overlaps a lens of the high-transmission region HA. The central region HTA may be an area of the high-transmission region HA, which area has the highest transmittance of visible light. For simplification of description, FIG. 4A only exemplarily shows the receiving and output parts that are components of the electronic module EM. However, it is to be understood that other arrangements may be used.

In the embodiment, the central region HTA may have a circular shape when in a plan view. The pattern region PA may have an annular shape that surrounds the central region HTA. The line region LA may have an annular shape that surrounds the pattern region PA. This, however, is exemplarily illustrated, and the central region HTA may be designed to have various shapes depending on a shape of the receiving or output part of the electronic module EM. For example, the central region HTA may be designed to have any various shape, such as an elliptical shape, a polygonal shape, and/or any shape having at least one curved side.

The hole signal lines HSL1, HSL2, and HSL3 are disposed on the line region LA. For simplification of description, FIG. 4A shows a first hole signal line HSL1, a second hole signal line HSL2, and a third hole signal line HSL3 that correspond to ones of hole signal lines.

The first hole signal line HSL1 and the second hole signal line HSL2 constitute the display unit DU. The first hole signal line HSL1 is illustrated as being disposed between the second insulation layer 20 and the third insulation layer 30. The first hole signal line HSL1 may be a scan line that is connected to pixels adjacent to the high-transmission region HA. The first hole signal line HSL1 may provide the same scan signal via the line region LA to pixels that are spaced apart from each other across the high-transmission region HA.

The second hole signal line HSL2 is illustrated as being disposed between the third insulation layer 30 and the fourth insulation layer 40. The second hole signal line HSL2 may be a data line that is connected to pixels adjacent to the high-transmission region HA. The second hole signal line HSL2 electrically connects to each other, via the line region LA, pixels that are spaced apart from each other across the high-transmission region HA.

The third hole signal line HSL3 is disposed on the sixth insulation layer 60 and constitutes the sensing unit SU. In the present embodiment, although the third hole signal line HSL3 is exemplarily illustrated as being disposed between the first sensing insulation layer 71 and the second sensing insulation layer 72, the third hole signal line HSL3 may be disposed between the second sensing insulation layer 72 and the third sensing insulation layer 73.

The third hole signal line HSL3 may be a connection line that is connected to sensing patterns adjacent to the high-transmission region HA. For example, the third hole signal line HSL3 connects to each other, via the line region LA, two first adjacent patterns SP1H (or two second adjacent patterns SP2H) that are spaced apart from each other across the high-transmission region HA. Therefore, even when the sensing electrodes TE1 and TE2 pass through the high-transmission region HA, it may be possible to prevent issues such as a reduction in sensitivity.

The electronic panel EP may further include at least a pair of grooves GV1 and GV2, a dam DM, and a planarization pattern OCT. The grooves GV1 and GV2, the dam DM, and the planarization pattern OCT are disposed in the high-transmission region HA.

The grooves GV1 and GV2 may be disposed on the line region LA of the high-transmission region HA. The grooves GV1 and GV2 may be formed when at least a portion of the base substrate BS is recessed. The grooves GV1 and GV2 are formed to have depths that do not penetrate the base substrate BS. The grooves GV1 and GV2 may include a first groove GV1 and a second groove GV2 that are spaced apart from each other.

The first groove GV1 may be defined relatively close or adjacent to the active region AA, and may be filled with the organic layer 62. The second groove GV2 may be defined relatively close or adjacent to the central region HTA, and may be spaced apart from the organic layer 62 and sequentially covered with the first inorganic layer 61 and the second inorganic layer 63. Each of the first and second grooves GV1 and GV2 may have either a closed line shape that surrounds the central region HTA or an intermittent line shape that surrounds at least a portion of an edge of the central region HTA, but the present inventive concepts are not necessarily limited thereto.

The first insulation layer 10 may have a shape that is cut on each of the first and second grooves GV1 and GV2. The control layer EL and the second electrode E2 may be cut on each of the first and second grooves GV1 and GV2. Because the grooves GV1 and GV2 are further included in the electronic panel EP, according to the present inventive concepts, the grooves GV1 and GV2 may break continuation of one or more of the control layer EL and the second electrode E2 that are capable of serving as pathways of external moisture or oxygen, which may result in the prevention of damage to elements disposed on the active region AA.

Each of the first and second grooves GV1 and GV2 may have an inside filled with a partial pattern separated from the control layer EL or the second electrode E2, and may be covered with one or more of the first inorganic layer 61 and the second inorganic layer 63. Therefore, when the electronic panel EP is fabricated, certain patterns may be prevented from moving into and affecting other elements. Accordingly, the electronic panel EP may be fabricated with increased reliability. This, however, is exemplarily illustrated. For the electronic panel EP according to an embodiment of the present inventive concepts, the grooves GV1 and GV2 may be provided as a single component or may be omitted, but the present inventive concepts are not necessarily limited thereto.

The dam DM is disposed on the line region LA, restricting a formation region of the organic layer 62 and preventing an additional expansion of the formation region. The dam DM may be disposed between the first and second grooves GV1 and GV2. The dam DM is illustrated as a stack structure including a plurality of insulation patterns IP1 and IP2. This, however, is exemplarily illustrated, and the dam DM may have but is not necessarily limited to having a single-layered structure.

The line region LA may be omitted from the high-transmission region HA according to the present embodiment. For example, the high-transmission region HA may include only the central and pattern regions HTA and PA, and the active region AA may be designed to directly adjoin the pattern region PA. In this case, the first and second grooves GV1 and GV2, the dam DM, or the hole signal lines HSL1, HSL2, and HSL3 may be omitted. This, however, is exemplarily illustrated. The high-transmission region HA may be designed to have various shapes as long as the high-transmission region HA may include the central region HTA and the pattern region PA, but the present inventive concepts are not necessarily limited thereto.

The planarization pattern OCT includes an organic material. The planarization pattern OCT may be disposed under the sensing unit SU and in the high-transmission region HA. The planarization pattern OCT may at least partially overlap with the central region HTA of the high-transmission region HA. The planarization pattern OCT may cover a non-planar surface of the high-transmission region HA, which non-planar surface is formed by the dam DM or the grooves GV1 and GV2, and thus may provide a planar surface to an upper portion of the high-transmission region HA. Accordingly, the high-transmission region HA may be stably provided with the planar surface on its portion where the organic layer 62 is not disposed.

The planarization pattern OCT may be optically transparent. For example, the planarization pattern OCT may have a visible light transmittance equal to or greater than about 90%.

In an embodiment, the first inorganic layer 61 may be removed from the central region HTA. The first inorganic layer 61 may have a transmittance of visible light that is less than that of the second inorganic layer 63. According to the present inventive concepts, the first inorganic layer 61 may be provided to have a shape that does not overlap the central region HTA, with the result that the central region HTA may increase in transmittance of visible light.

In addition, a boundary pattern HPP may further be included in the electronic panel EP, according to an embodiment of the present inventive concepts. The boundary pattern HPP is disposed along an edge of the central region HTA. The boundary pattern HPP may be disposed on the pattern region PA and may have a shape that surrounds the central region HTA. The boundary pattern HPP may define a boundary between the central region HTA and a region (e.g., the line region LA) adjacent to the central region HTA.

Figure 4B:
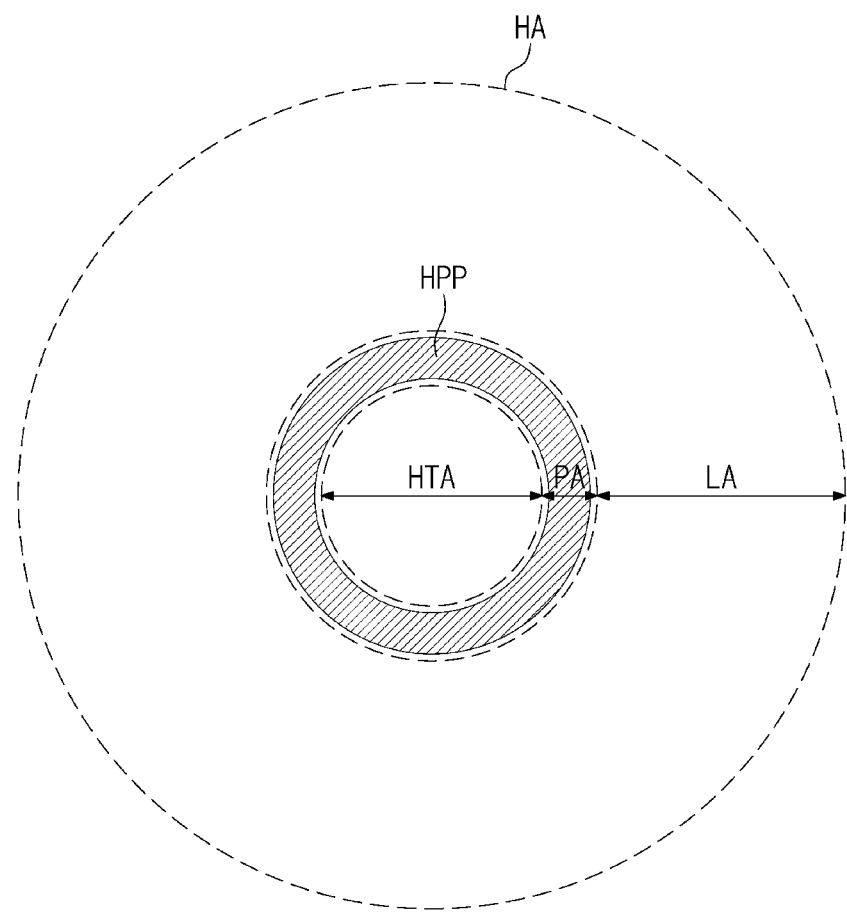
FIGS. 4B to 4E are simplified plan views partially illustrating an electronic panel according to some example embodiments of the present inventive concepts.

For example, as shown in FIG. 4B, the boundary pattern HPP may have a closed line shape when viewed in plan. The boundary pattern HPP has an annular shape that is continuously connected along the edge of the central region HTA having a circular ring shape.

Figure 4C:
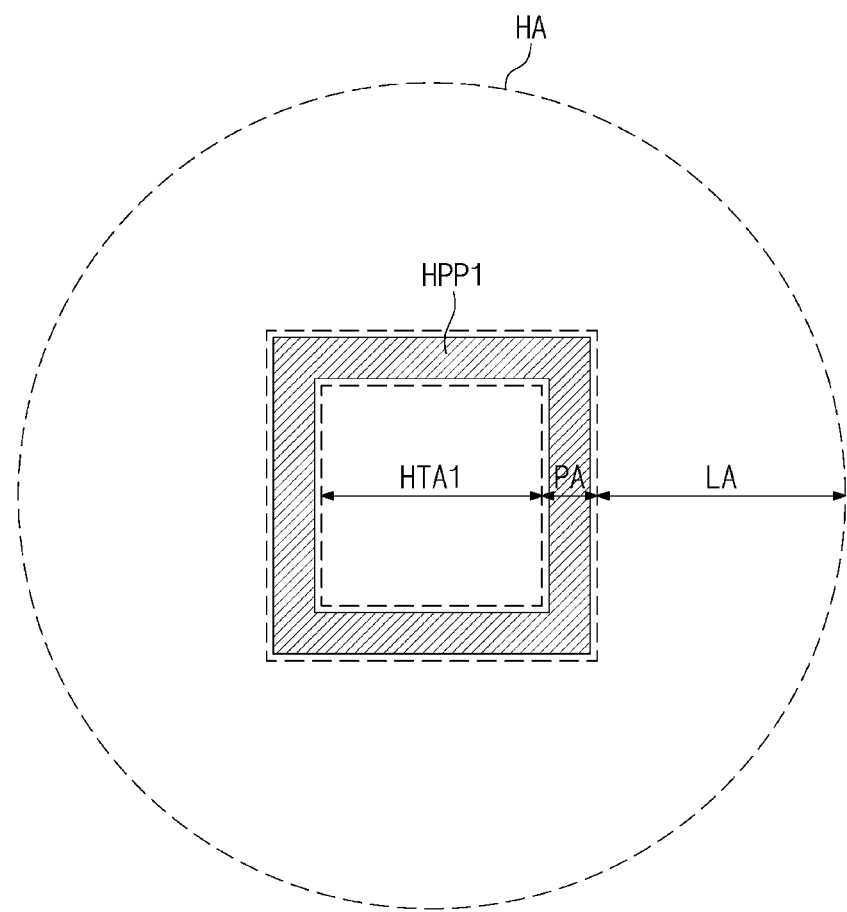

For example, as shown in FIG. 4C, a boundary pattern HPP1 may have a closed polygonal shape. In the present embodiment, the boundary pattern HPP1 has an annularly rectangular shape. The shape of the boundary pattern HPP1 may be variously designed along that of a central region HTA1.

Figure 4D:
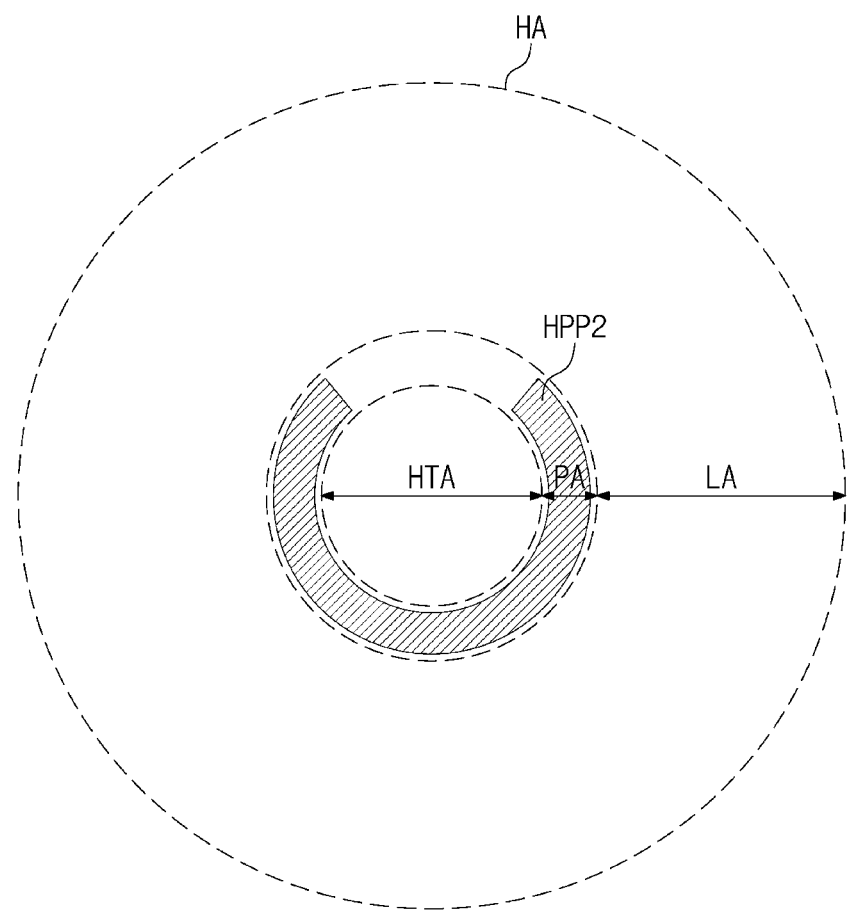

For example, as shown in FIG. 4D, a boundary pattern HPP2 may have an open curved shape when viewed in a plan. The boundary pattern HPP2 is illustrated as having a shape obtained by removing a portion from the boundary pattern HPP of the closed line shape shown in FIG. 4B.

Figure 4E:
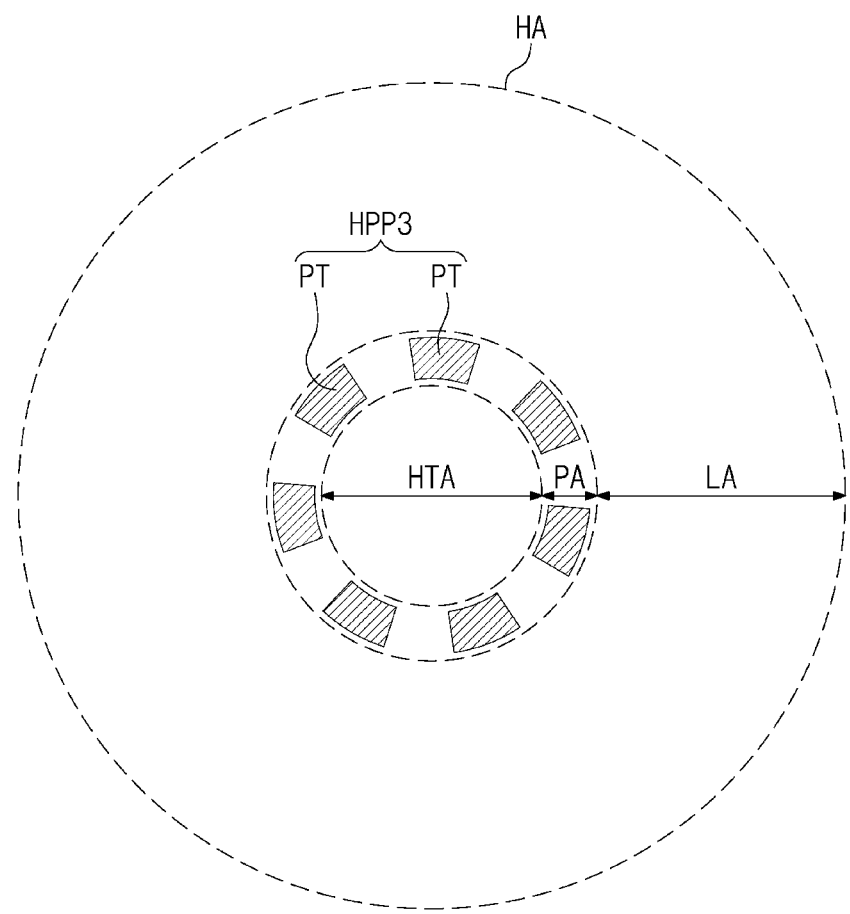

For example, as shown in FIG. 4E, a boundary pattern HPP3 may have an intermittently divided shape. The boundary pattern HPP3 may include a plurality of patterns PT that are spaced apart from each other. The patterns PT are arranged along the edge of the central region HTA and form the boundary pattern HPP3 having the intermittent shape. As long as the boundary patterns HPP, HPP1, HPP2, and HPP3, according to some example embodiments of the present inventive concepts, are disposed on the pattern region PA, the boundary patterns HPP, HPP1, HPP2, and HPP3 may have various shapes, and the present inventive concepts are not necessarily limited thereto.

Referring back to FIG. 4A, the boundary pattern HPP may be optically opaque. Because the boundary pattern HPP is disposed on the pattern region PA that does not overlap the central region HTA, it may be possible to easily prevent interference between the boundary pattern HPP and light that is incident onto or is output from the electronic module EM.

The boundary pattern HPP may include an inorganic material. For example, the boundary pattern HPP may include a metallic material or an inorganic insulation material. The boundary pattern HPP may be patterned by dry etching, wet etching, or laser patterning. The boundary pattern HPP may be formed by various processes, and the formation of the boundary pattern HPP is not necessarily limited to a particular embodiment.

The electronic panel EP, according to the present inventive concepts, may be configured such that the central region HTA overlapping the electronic module EM is formed only of insulation layers each of whose transmittance of visible light is high. Among insulation layers that constitute the electronic panel EP, an insulation layer with a high transmittance of visible light is disposed on the central region HTA, and an insulation layer with a low transmittance of visible light is removed from the central region HTA. The insulation layer with a high transmittance of visible light includes the base substrate BS, the first insulation layer 10, the second inorganic layer 63, the planarization pattern OCT, and the first, second, and third sensing insulation layers 71, 72, and 73, and the insulation layer with a low transmittance of visible light includes one or more of the control layer EL and the first inorganic layer 61. In this configuration, because the central region HTA is provided to have a high transmittance of visible light, the electronic module EM may satisfactorily operate even without a mechanical hole that penetrates the central region HTA.

Figure 5A:
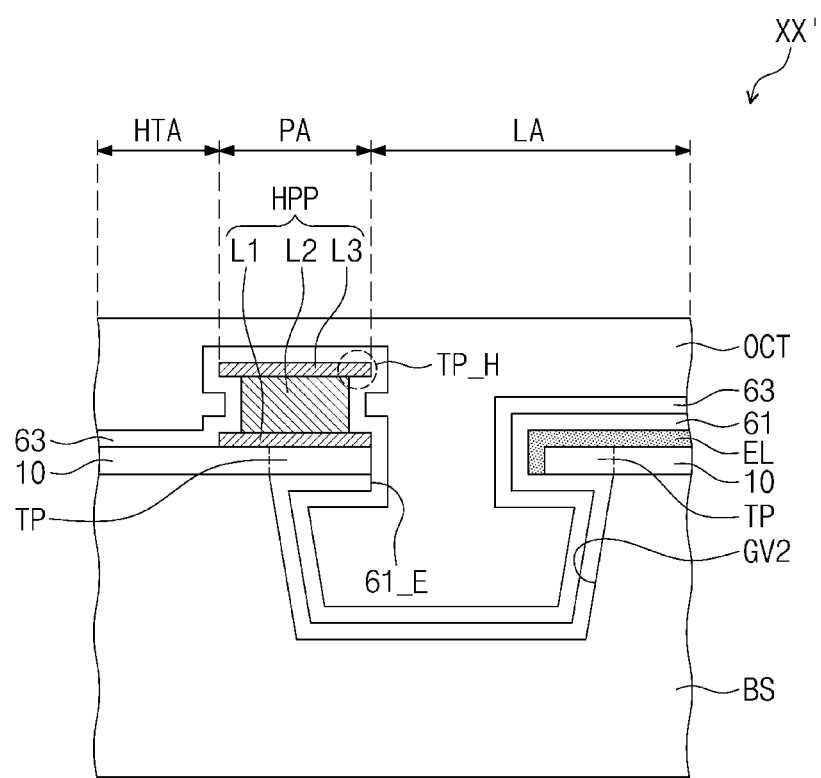
FIG. 5A is an enlarged view illustrating section XX' of FIG. 4A.
Figure 5B:
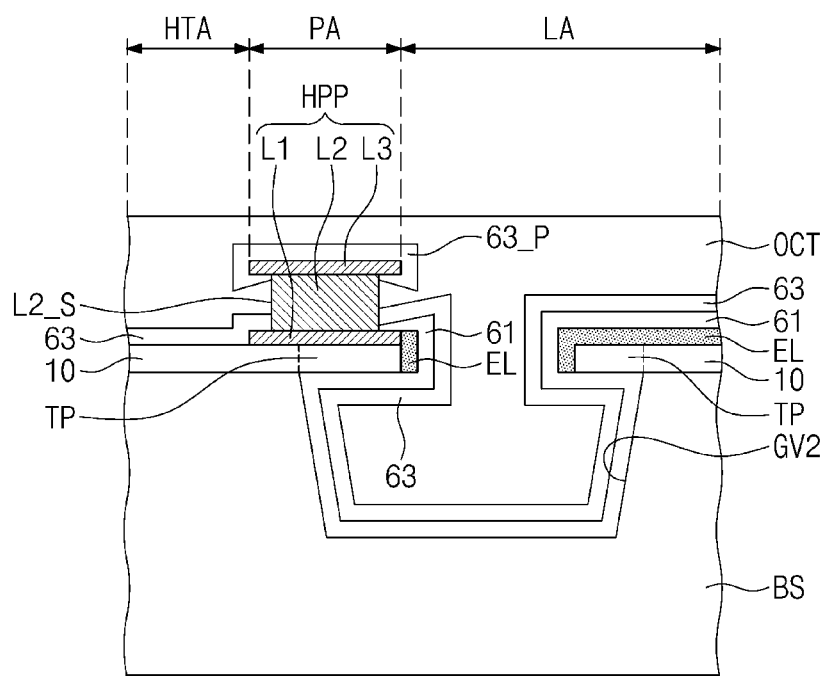
FIG. 5B is an enlarged cross-sectional view partially illustrating an electronic panel according to some example embodiments of the present inventive concepts.

FIG. 5A is an enlarged view illustrating section XX' of FIG. 4A FIG. 5B is an enlarged cross-sectional view partially illustrating an electronic panel, according to some example embodiments of the present inventive concepts. For simplification of description, FIG. 5B shows a section that corresponds to that of FIG. 5A. The present inventive concepts will be described below with reference to FIGS. 5A and 5B. The same components as those discussed with reference to FIGS. 1A to 4E are allocated the same reference symbols thereto, and a repetitive explanation will be omitted. It is to be understood that to the extent that certain details are not provided, these details nay be at least similar to those details provided elsewhere in the specification for corresponding elements.

As shown in FIG. 5A, the second groove GV2 has an undercut shape. For example, an end of the first insulation layer 10 forms a tip portion TP that protrudes toward the second groove GV2. The control layer EL may be cut on the second groove GV2 by the tip portion TP. For simplification of description, the second electrode (see E2 of FIG. 4A) is omitted. The second groove GV2 may be filled with the planarization pattern OCT.

The boundary pattern HPP, according to the present embodiment, may include a plurality of layers. In the present embodiment, the boundary pattern HPP includes first, second, and third layers L1, L2, and L1 that are sequentially stacked. The first, second, and third layers L1, L2, and L3 may cause the boundary pattern HPP to have an undercut shape. For example, the third layer L3 that corresponds to an uppermost one of the first, second, and third layers L1, L2, and L3 may have an end TP_H that protrudes to a greater extent than the second layer L2 that is disposed under the third layer L.

Each of the first, second, and third layers L1, L2, and L3 may include an inorganic material. For example, each of the first, second, and third layers L1, L2, and L3 may include a metallic material or an inorganic insulation material. The first, second, and third layers L1, L2, and L3 may each be formed of a material capable of being etched, and the first, second, and third layers L1, L2, and L3 may be formed of materials capable of being etched independently of each other. Alternatively, each of the first, second, and third layers L1, L2, and L3 may be formed of a material capable of being patterned by laser.

For example, among the first, second, and third layers L1, L2, and L3, at least the second and third layers L2 and L3 may have different etch rates with respect to the same etchant. For example, the second and third layers L2 and L3 may be etched with different etchants from each other. According to the present inventive concepts, because the first, second, and third layers L1, L2, and L3 are controlled independently of each other in terms of the degree of patterning, it may be possible to easily form the boundary pattern HPP having an undercut shape.

This, however, is exemplarily explained. As long as the boundary pattern HPP may have an undercut shape when viewed in cross-section, the boundary pattern HPP may be formed to have a single-layered structure or may be formed of a single material, but the present inventive concepts are not necessarily limited thereto.

The first inorganic layer 61 covers an inside of the second groove GV2. An end 61_E of the first inorganic layer 61 extends to a portion of the first insulation layer 10, which portion protrudes toward the second groove GV2, and the end 61_E does not extend to an upper portion of the boundary pattern HPP or to the central region HTA. The first inorganic layer 61 might not overlap the central region HTA.

The second inorganic layer 63 overlaps the line region LA, the pattern region PA, and the central region HTA. The second inorganic layer 63 passes through the inside of the second groove GV2, and covers the boundary pattern HPP and the central region HTA. In the present embodiment, the second inorganic layer 63 may cover an undercut lateral surface of the boundary pattern HPP.

Alternatively, as shown in FIG. 5B, the second inorganic layer 63 may be cut at an area where the boundary pattern HPP is formed. When the boundary pattern HPP has a large degree of undercut, or when the end TP_H of the third layer L3 has a high degree of protrusion with respect to the second layer L2, a portion 63_P may be formed to be separated from the second inorganic layer 63. Accordingly, a side surface L2_S of the second layer L2 may be exposed from the second inorganic layer 63.

A portion of the control layer EL may further be disposed on an end of the tip portion TP. When the electronic panel EP is formed, the portion of the control layer EL might not be removed, but may remain on the end of the tip portion TP. According to the present inventive concepts, as long as the control layer EL does not overlap the central region HTA, the control layer EL may be provided on various locations, but the present inventive concepts are not necessarily limited thereto.

FIGS. 6A to 6E are cross-sectional views illustrating a method of forming a boundary pattern according to some example embodiments of the present inventive concepts. The present inventive concepts will be discussed below with reference to FIGS. 6A to 6E.

Figure 6A:
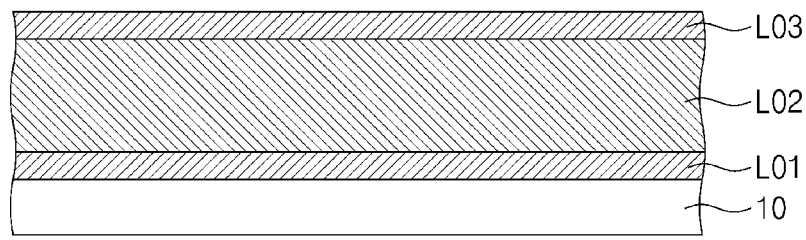
FIGS. 6A to 6E are cross-sectional views illustrating a method of forming a boundary pattern according to some example embodiments of the present inventive concepts.
Figure 6B:
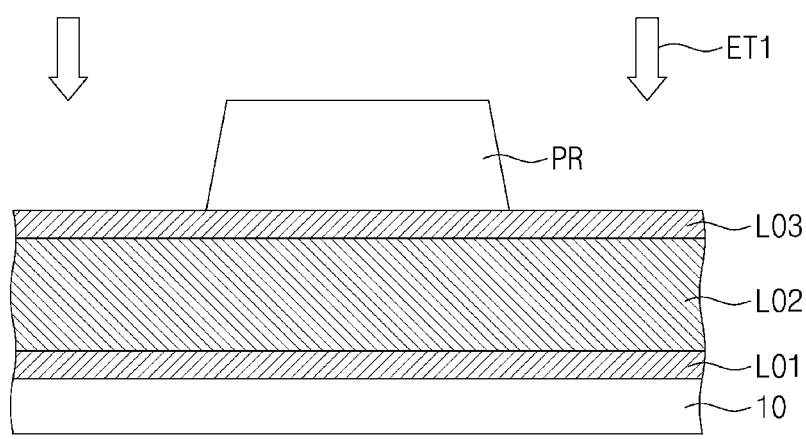
Figure 6C:
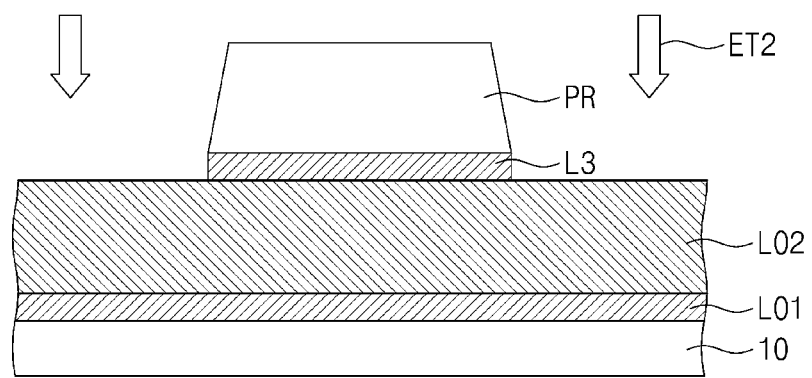
Figure 6D:
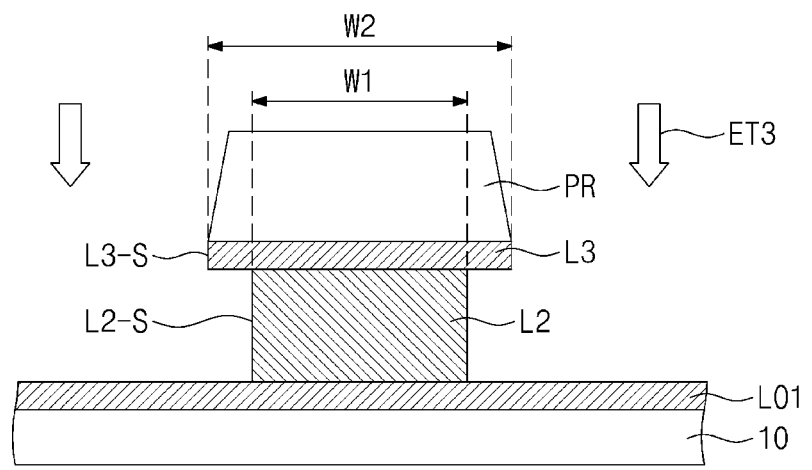
Figure 6E:
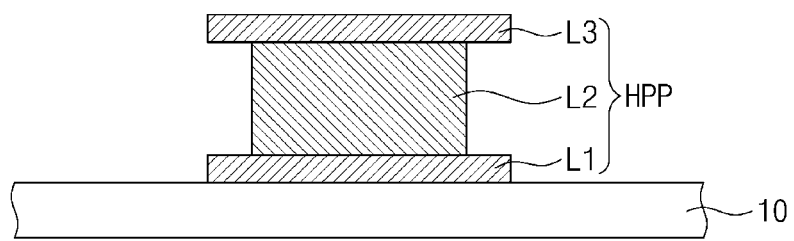

As shown in FIG. 6A, first, second, and third preliminary layers L01, L02, and L03 are sequentially formed on a first insulation layer 10. Each of the first, second, and third preliminary layers L01, L02, and L03 may be formed by deposition or coating. Each of the first, second, and third preliminary layers L01, L02, and L03 may include metal. In this case, the third preliminary layer L03 includes a different material from that of the second preliminary layer L02.

Afterwards, as shown in FIGS. 6B to 6E, a photoresist pattern PR is used as an etching mask to etch the first, second, and third preliminary layers L01, L02, and L03. A first etching material ET1 may be used such that the third preliminary layer L03 is etched at its portion exposed from the photoresist pattern PR to form a third layer L3.

After that, a second etching material ET2 may be used such that the second preliminary layer L02 is etched at its portion exposed from the third layer L3 to form a second layer L2. The second etching material ET2 may include various materials. For example, the second etching material ET2 may be different from the first etching material ET1.

The second etching material ET2 may be a material that does not react with the third layer L3, but selectively reacts with only the second preliminary layer L02.

For example, the second etching material ET2 may be the same as the first etching material ET1. Compared to the third preliminary layer L03, the second preliminary layer L02 may be formed of a material whose reactivity is relatively high with respect to the second etching material ET2.

The second etching material ET2 may produce isotropic etching. Therefore, the second preliminary layer L02 may be etched at its portion that overlaps the third layer L3, with result that the second layer L2 may be formed to have an undercut shape from the third layer U. A side surface L3_S of the third layer L3 may thus protrude from a side surface L2_S of the second layer L2. A width W1 of the second layer L2 may be less than a width W2 of the third layer L3.

Thereafter, a third etching material ET3 may be used such that the first preliminary layer L01 is etched at its portion that does not overlap the photoresist pattern PR to form a first layer L. The third etching material ET3 may be different from the second etching material ET2. Accordingly, while the first preliminary layer L01 is etched, the second layer L2 may stably maintain its shape.

The third etching material ET3 may produce anisotropic etching. Therefore, the first layer L1 may be formed to have an area that at least partially overlaps the photoresist pattern PR. According to the present inventive concepts, when the stacked first, second, and third layers L1, L2, and L3 are controlled in terms of the degree of etching, it may be possible to easily form a boundary pattern HPP having an undercut shape.

Figure 7:
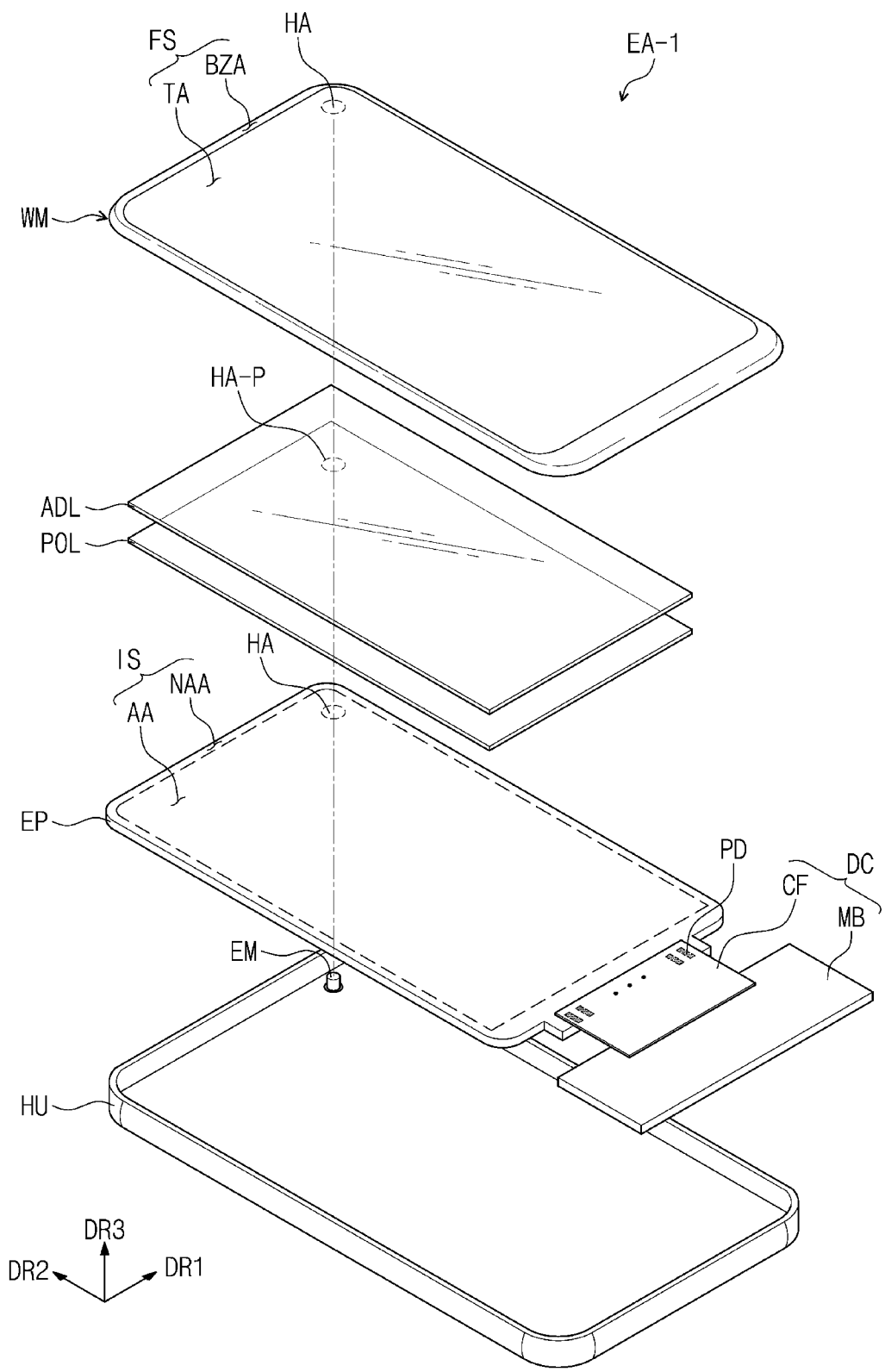
FIG. 7 is an exploded perspective view illustrating an electronic apparatus according to some example embodiments of the present inventive concepts.
Figure 8A:
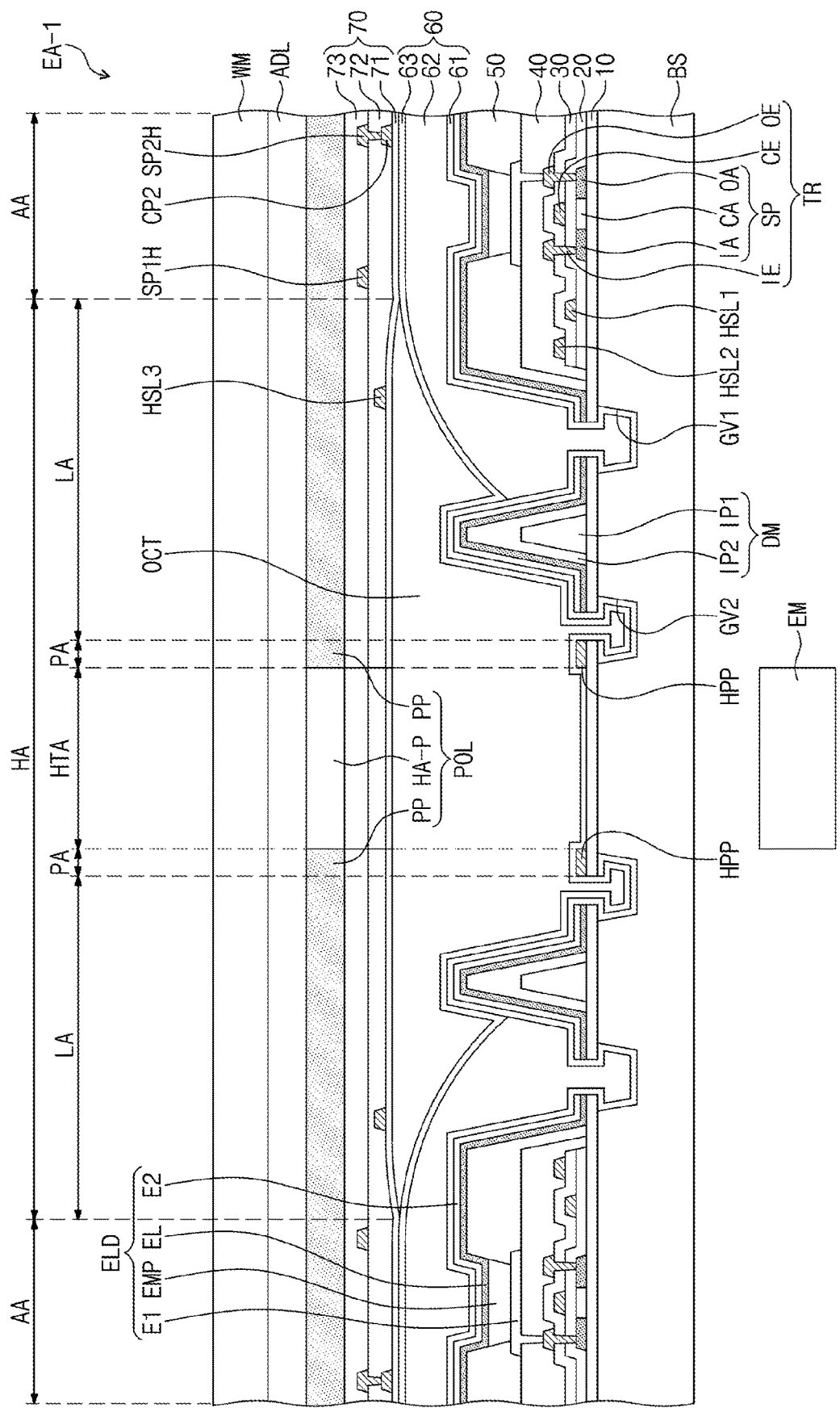
FIGS. 8A and 8B are cross-sectional views illustrating an electronic apparatus according to some example embodiments of the present inventive concepts.
Figure 8B:
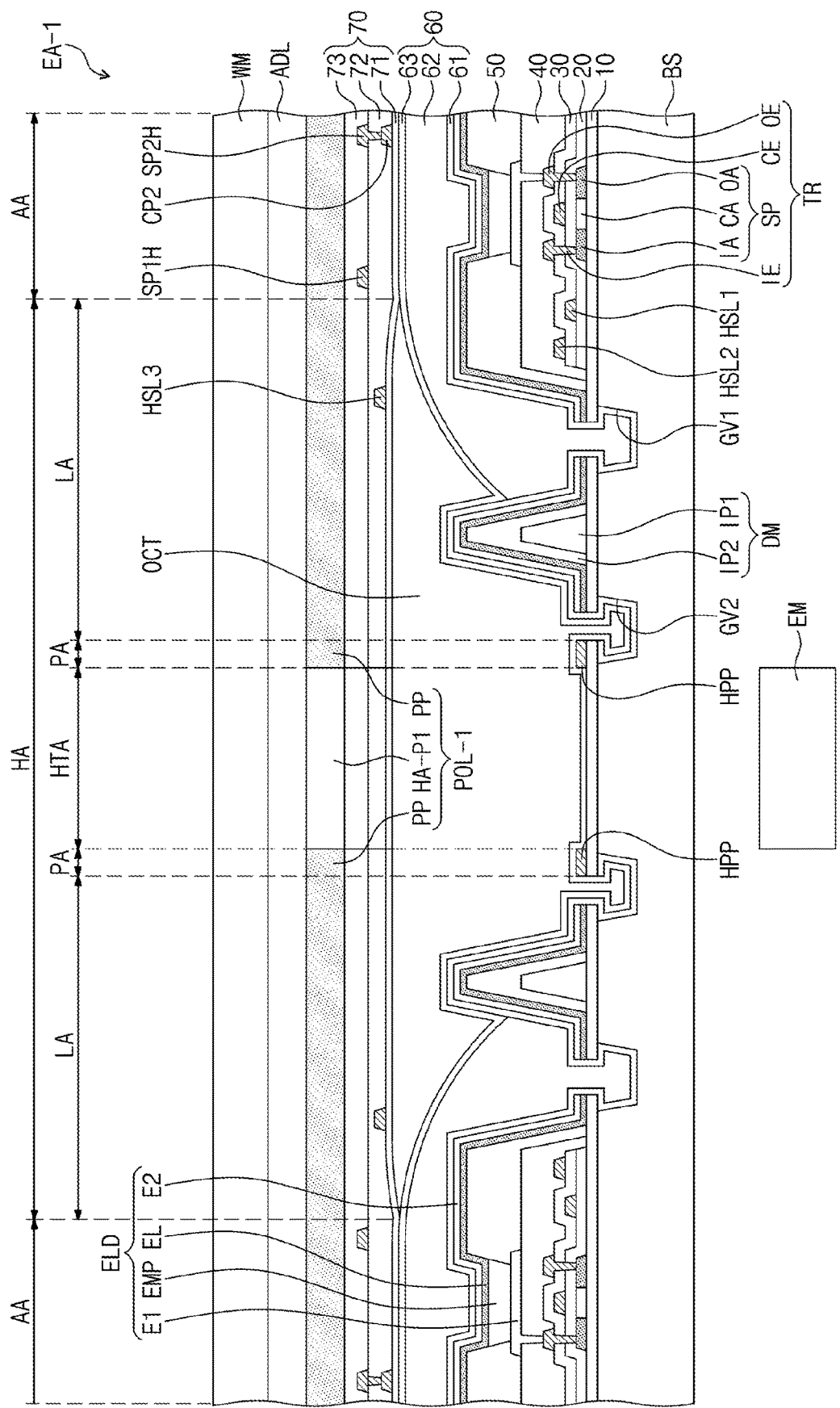

FIG. 7 is an exploded perspective view illustrating an electronic apparatus according to some example embodiments of the present inventive concepts. FIGS. 8A and 8B illustrate cross-sectional views showing an electronic apparatus according to some example embodiments of the present inventive concepts. FIGS. 8A and 8B show a section that corresponds to that of FIG. 4A. The present inventive concepts will be described below with reference to FIGS. 7,8A, and 8B.

As shown in FIG. 7, compared to the electronic apparatus EA illustrated in FIG. 1B, an electronic apparatus EA-1 may further include an antireflection layer POL and an adhesion layer ADL.

The antireflection layer POL may be disposed between the window WM and the electronic panel EP. The antireflection layer POL causes an external light incident from outside the window WM to have a reduced reflectance with respect to the electronic panel EP. In the present embodiment, the antireflection layer POL may include a polarizing film or a color filter.

The adhesion layer ADL is disposed between the antireflection layer POL and the window WM. The adhesion layer ADL combines the antireflection layer POL with the window WM. When the antireflection layer POL, according to the present inventive concepts, is a color filter formed on the electronic panel EP, the adhesion layer ADL may substantially combine the electronic panel EP with the window WM. The adhesion layer ADL may include an optical clear adhesive, an optical clear resin, or a pressure sensitive adhesive, and the material of the adhesion layer ADL is not necessarily limited to a particular embodiment as long as the adhesion layer ADL is optically transparent.

The antireflection layer POL, according to an embodiment of the present inventive concepts, may include a hole HA-P. The hole HA-P may be defined at a location that corresponds to the high-transmission region HA. The hole HA-P may be a portion having a transmittance of visible light that is greater than that of any portion around the hole HA-P.

As shown in FIG. 8A, the antireflection layer POL may include the hole HA-P and a polarizing portion PP. The polarizing portion PP may be a portion with polarization characteristics, or a portion other than the hole HA-P. The polarizing portion PP overlaps the active region AA and the line region LA.

The hole HA-P may at least partially overlap the high-transmission region HA. The hole HA-P may have a size that corresponds to at least the central region HTA of the high-transmission region HA, and may be defined at a location that overlaps the central region HTA. In the present embodiment, the hole HA-P may be formed by bleaching a portion of the antireflection layer POL to remove polarization characteristics.

Alternatively, as shown in FIG. 8B, a hole HA-P1 may penetrate an antireflection layer POL-1. Therefore, the antireflection layer POL-1 may provide a relatively high transmittance of visible light to an area that corresponds to the central region HTA.

According to the present inventive concepts, an increased transmittance of visible light may be provided to an area that corresponds to the electronic module EM, such that, even when the electronic panel EP has no hole formed therein, the electronic module EM may stably receive light incident onto the electronic panel EP, and that light released from the electronic module EM may be easily output through the electronic panel EP.

FIGS. 9A to 9L illustrate cross-sectional views showing a method of manufacturing an electronic apparatus according to some example embodiments of the present inventive concepts. The present inventive concepts will be discussed below with reference to FIGS. 9A to 9L. The same components as those discussed with reference to FIGS. 1A to 8B are allocated the same reference symbols thereto, and a repetitive explanation will be omitted. It is to be understood that to the extent that certain details are not provided, these details may be at least similar to those details provided elsewhere in the specification for corresponding elements.

Figure 9A:
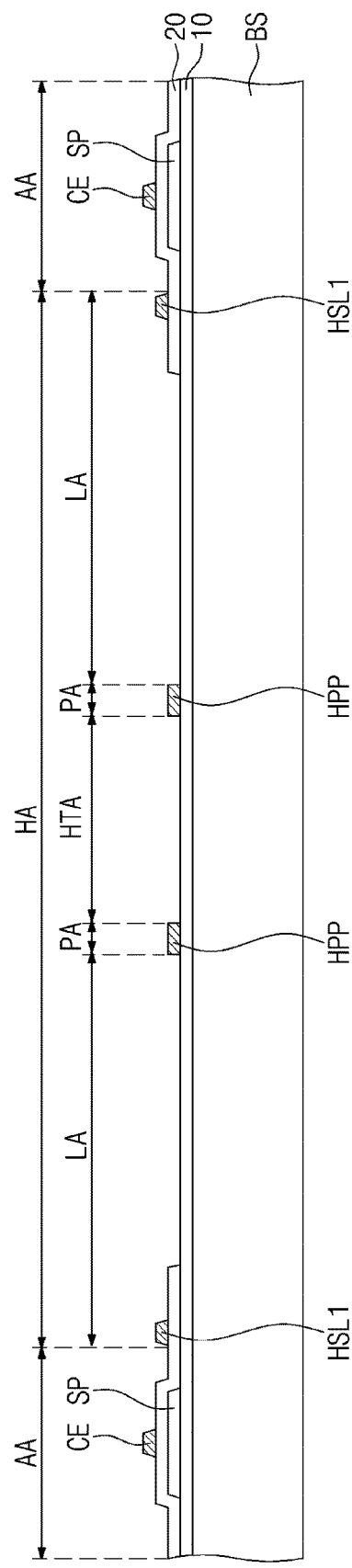
FIGS. 9A to 9L are cross-sectional views illustrating a method of manufacturing an electronic apparatus according to some example embodiments of the present inventive concepts.

As shown in FIG. 9A, a boundary pattern HPP and a control electrode CE are formed on a base substrate BS. In the present embodiment, it is illustrated that the boundary pattern HPP and the control electrode CE are formed from the same layer.

The boundary pattern HPP may be formed of the same material as that of the control electrode CE. In this case, a single mask may be used to simultaneously pattern the boundary pattern HPP and the control electrode CE, which may result in simplification of process and reduction in process cost. This, however, is exemplarily illustrated, and the boundary pattern HPP may include but is not necessarily limited to including a different material from that of the control electrode CE.

A first insulation layer 10, a second insulation layer 20, and a semiconductor pattern SP may be formed before the boundary pattern HPP and the control electrode CE are formed. The first insulation layer 10 may be formed by depositing an inorganic material on the base substrate BS or by coating an organic material on the base substrate BS. The first insulation layer 10 is formed of a material having a high transmittance of visible light. For example, the first insulation layer 10 may be formed of silicon oxide or silicon oxynitride.

Afterwards, the semiconductor pattern SP is formed. The semiconductor pattern SP may be formed by depositing or coating a semiconductor material on the first insulation layer 10 and then performing a patterning process. After that, the second insulation layer 20 is formed. In the present embodiment, an insulation material may be deposited or coated and then patterned to remove its portion that corresponds to a high-transmission region HA, with the result that the second insulation layer 20. This, however, is exemplarily illustrated. The second insulation layer 20, according to an embodiment of the present inventive concepts, may be formed to extend onto a location that corresponds to the high-transmission region HA, and in this case, a separate process may be omitted.

Figure 9B:
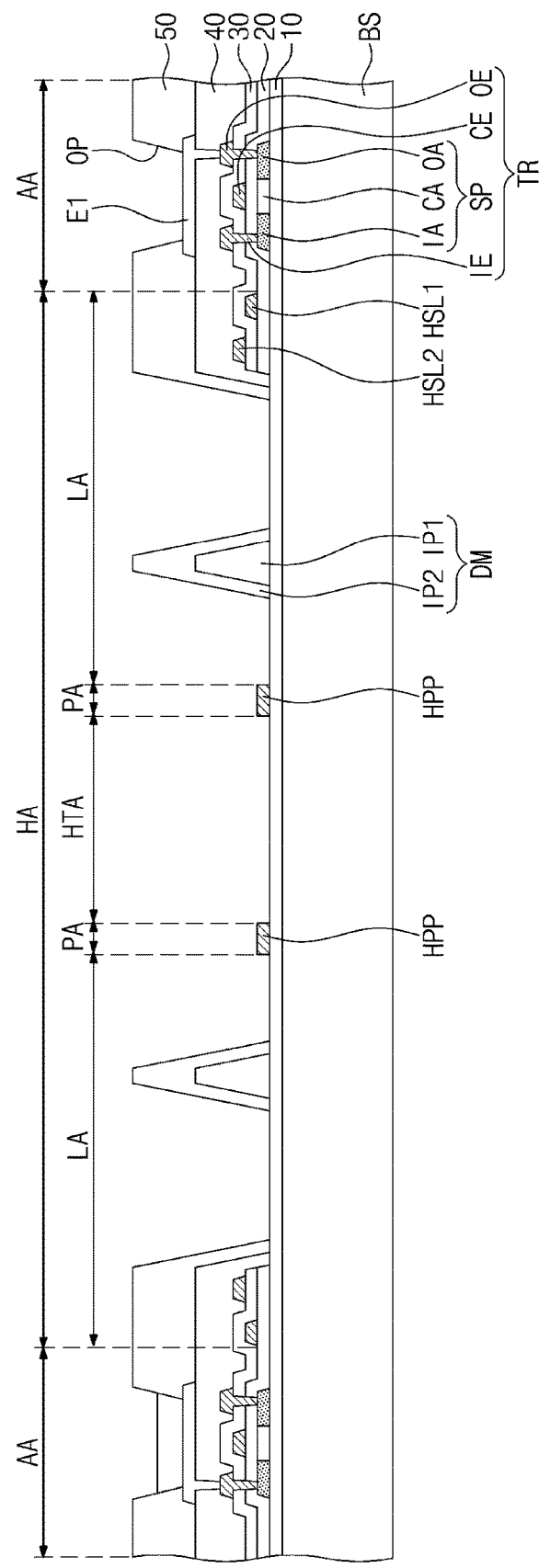

Thereafter, as shown in FIG. 9B, there may be formed a thin film transistor TR, third, fourth, and fifth insulation layers 30, 40, and 50, a dam DM, and a first electrode E1. The third, fourth, and fifth insulation layers 30, 40, and 50 may be formed by depositing or coating an insulation material and then patterning the insulation material.

The dam DM may include the same material as that of the third, fourth, and fifth insulation layers 30, 40, and 50. In this case, the same process may be performed to simultaneously form the dam DM and the third, fourth, and fifth insulation layers 30, 40, and 50. For example, an identical mask may be used such that the first insulation pattern IP1 of the first and second insulation patterns IP1 and IP2 that constitute the dam DM is patterned simultaneously with the fourth insulation layer 40, and an identical mask may be used such that the second insulation pattern IP2 of the first and second insulation patterns IP1 and IP2 is patterned simultaneously with the fifth insulation layer 50. Accordingly, it may be possible to simplify processes and to reduce process cost.

When the fifth insulation layer 50 is formed, an opening OP may be formed. The opening OP is formed to expose at least a portion of the first electrode E1. When the opening OP is formed, the second insulation pattern IP2 may also be formed.

Figure 9C:
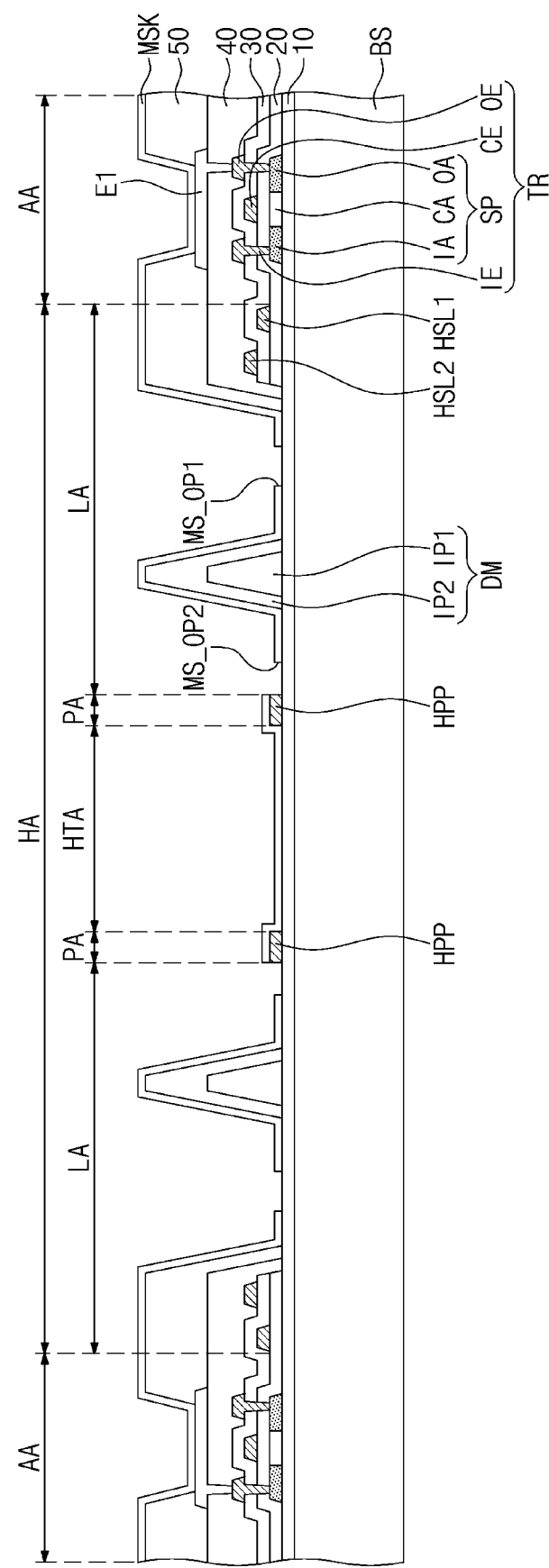

Afterwards, as shown in FIG. 9C, a mask MSK may be formed. The mask MSK may include metal or metal oxide. For example, the mask MSK may be formed of transparent conductive oxide.

The mask MSK covers the fifth insulation layer 50 and the dam DM. Mask openings MS_OP1 and MS_OP2 may be formed in the mask MSK. The mask openings MS_OP1 and MS_OP2 may each surround a central region HTA and may be spaced apart from each other.

Figure 9D:
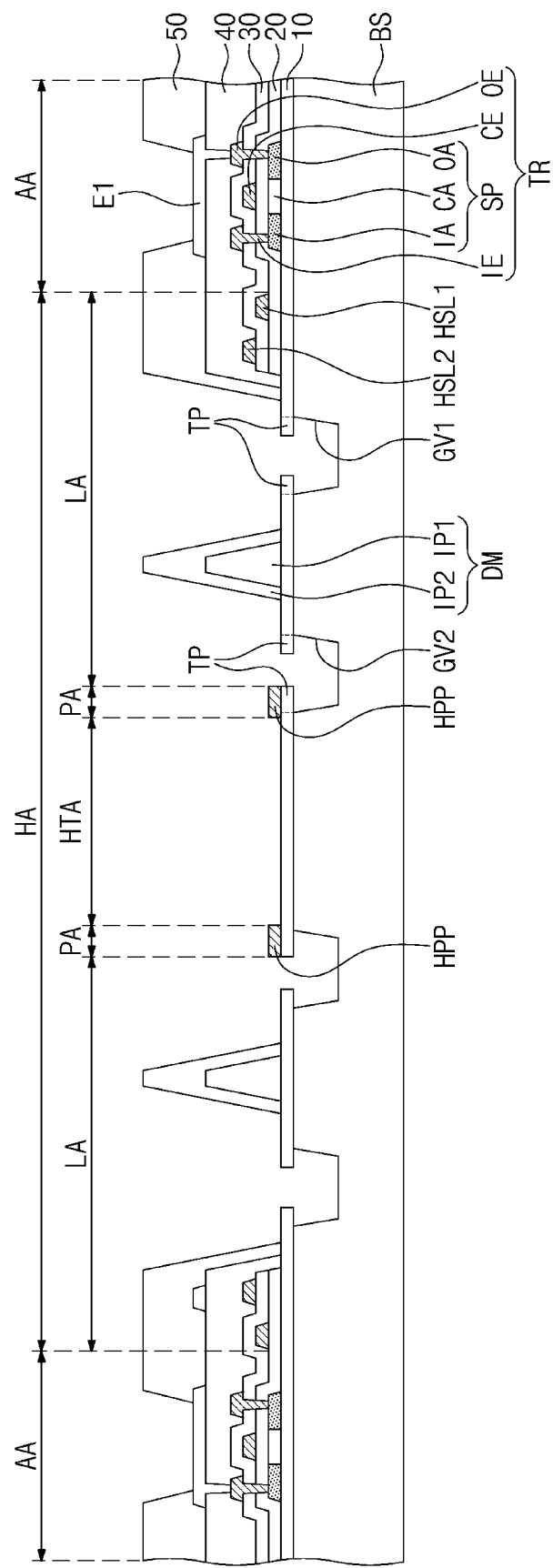

After that, as shown in FIG. 9D, the mask MSK may be used to pattern the first insulation layer 10 and the base substrate BS. The first insulation layer 10 is removed and cut at its portions that overlap the mask openings MS_OP1 and MS_OP2, and the base substrate BS is partially removed at its portions that overlap the mask openings MS_OP1 and MS_OP2 to form grooves GV1 and GV2 having their recessed shapes.

The grooves GV1 and GV2 may be formed to have their undercut shapes relative to the first insulation layer 10. Therefore, the first insulation layer 10 may have tips TP that protrude into the grooves GV1 and GV2. After that, the mask MSK is removed.

Figure 9E:
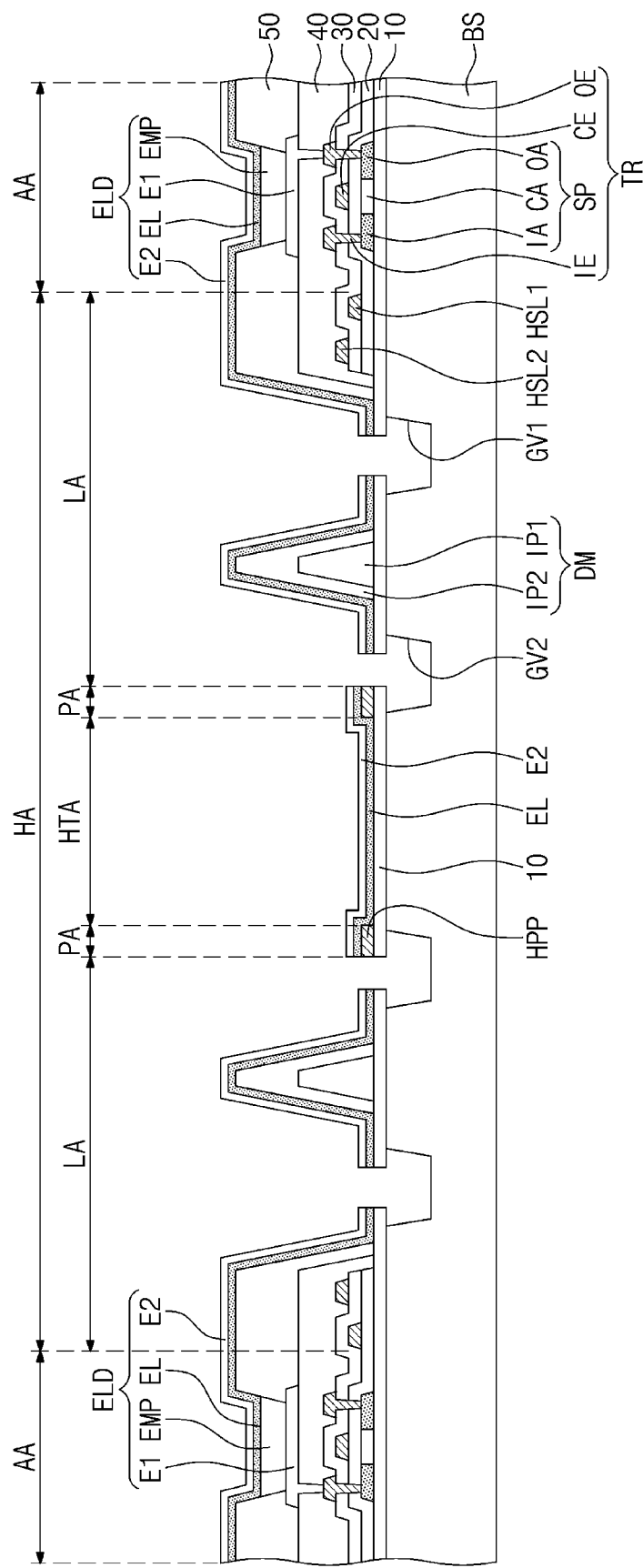

Thereafter, as shown in FIG. 9E, an emission pattern EMP, a control layer EL, and a second electrode E2 are sequentially formed to constitute a light emitting element ELD. The emission pattern EMP may be formed by filling the opening OP with a luminous material.

The control layer EL and the second electrode E2 may be formed by an evaporation process. In this case, because the control layer EL and the second electrode E2 are formed to have straightness, the grooves GV1 and GV2 may have neither the control layer EL nor the second electrode E2 at their portions screened with the tips TP. Accordingly, the control layer EL and the second electrode E2 may be cut at positions that overlap the grooves GV1 and GV2.

The control layer EL and the second electrode E2 may also be formed on the central region HTA and a pattern region PA. The control layer EL and the second electrode E2 cover lateral and top surfaces of the boundary pattern HPP.

Figure 9F:
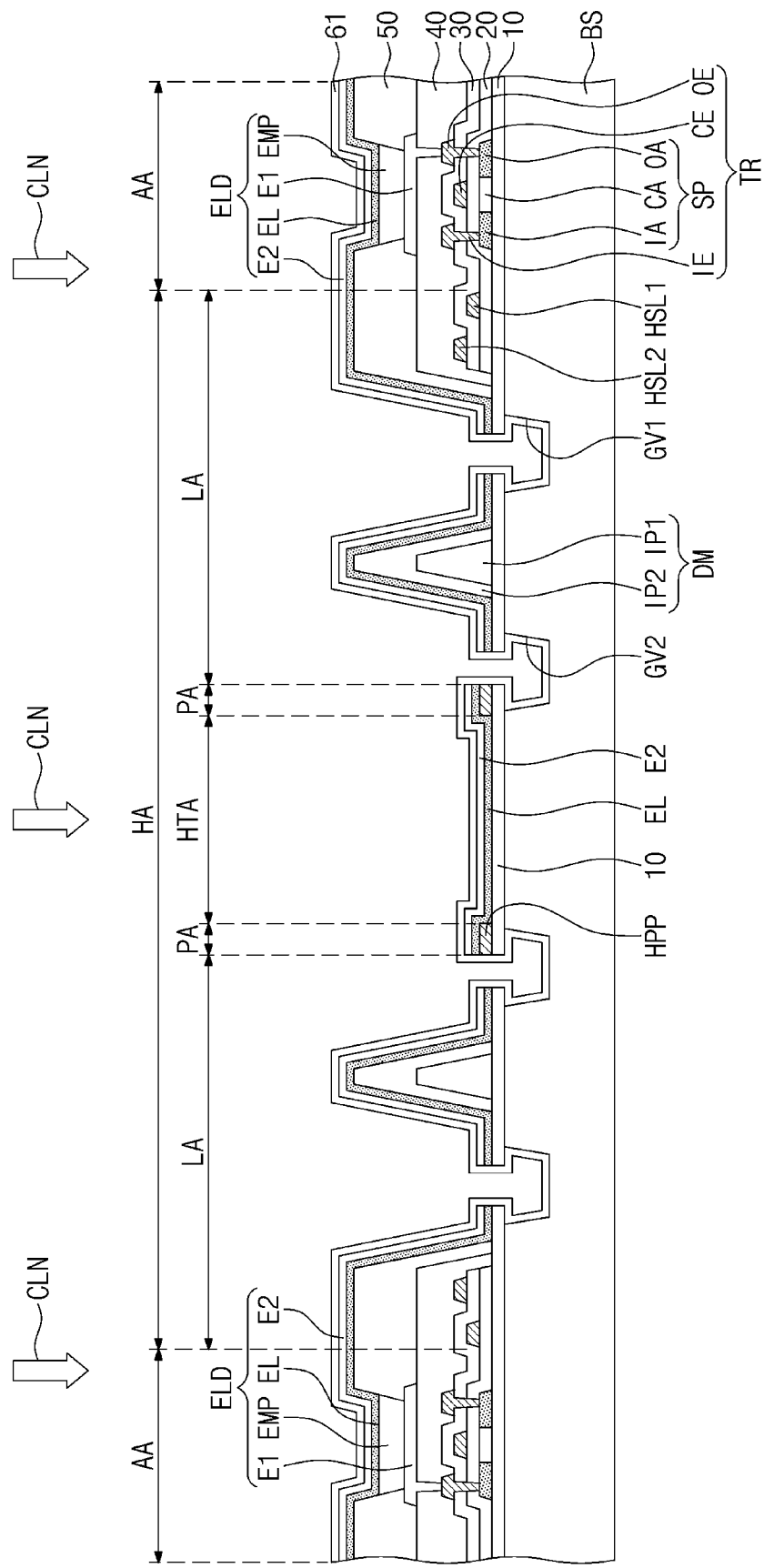
Figure 9G:
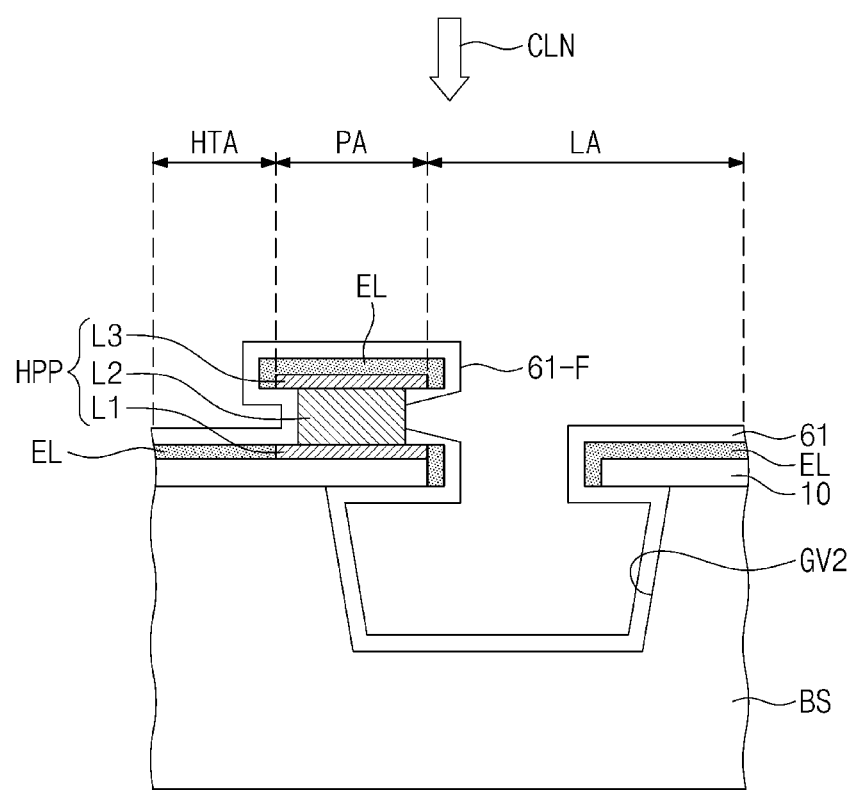

Afterwards, as shown in FIGS. 9F and 9G, a first inorganic layer 61 may be formed and then may undergo a cleaning process. The first inorganic layer 61 may be formed by depositing an insulation material. For example, silicon nitride may be deposited to form the first inorganic layer 61.

The deposition process of the first inorganic layer 61 may have isotropy. Therefore, the first inorganic layer 61 may be formed while covering inner surfaces of the grooves GV1 and GV2. In this case, an undercut shape of the boundary pattern HPP may cause the formation of a certain gap at a portion of the first inorganic layer 61. As illustrated in FIG. 9G, the first inorganic layer 61 may include a portion 61-F that overlaps the central region HTA and the pattern region PA, which the portion 61-F may be cut from other portion of the first inorganic layer 61 that overlaps a line region LA and may expose a portion of the boundary pattern HPP.

After the first inorganic layer 61 is formed, a cleaning solution CLN may be provided. The cleaning solution CLN removes foreign substances present on a surface of the first inorganic layer 61.

Figure 9H:
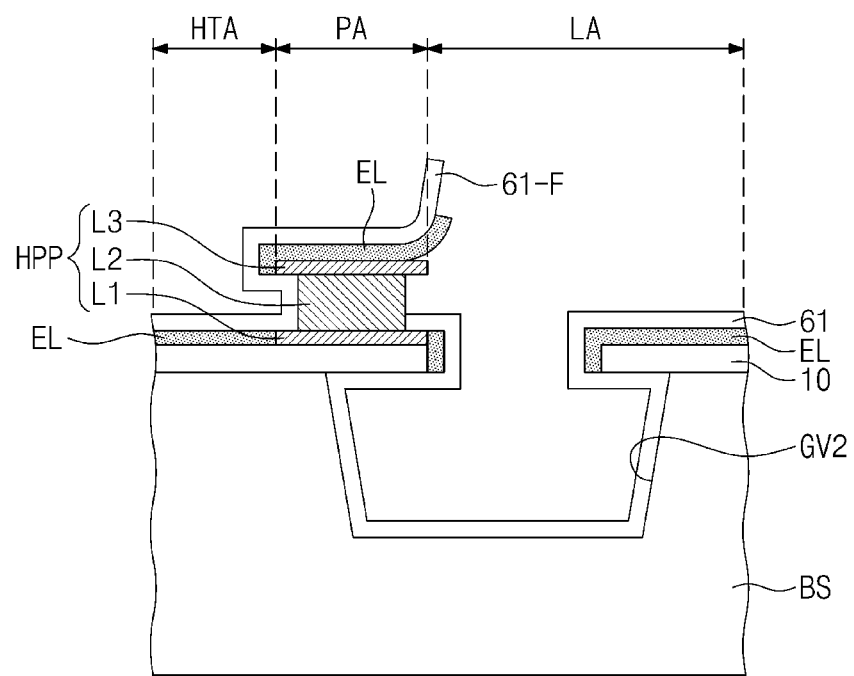
Figure 9I:
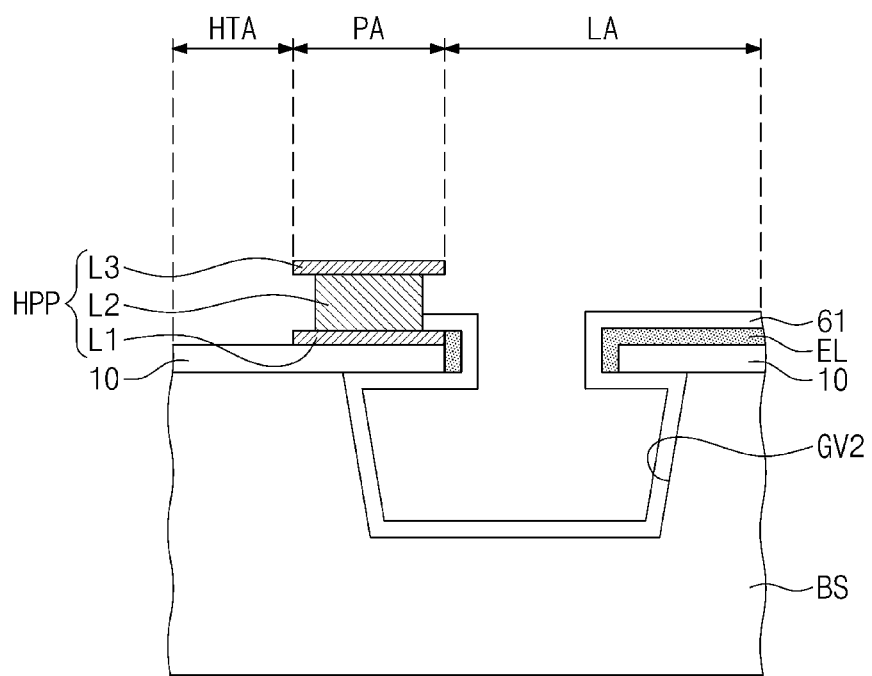
Figure 9J:
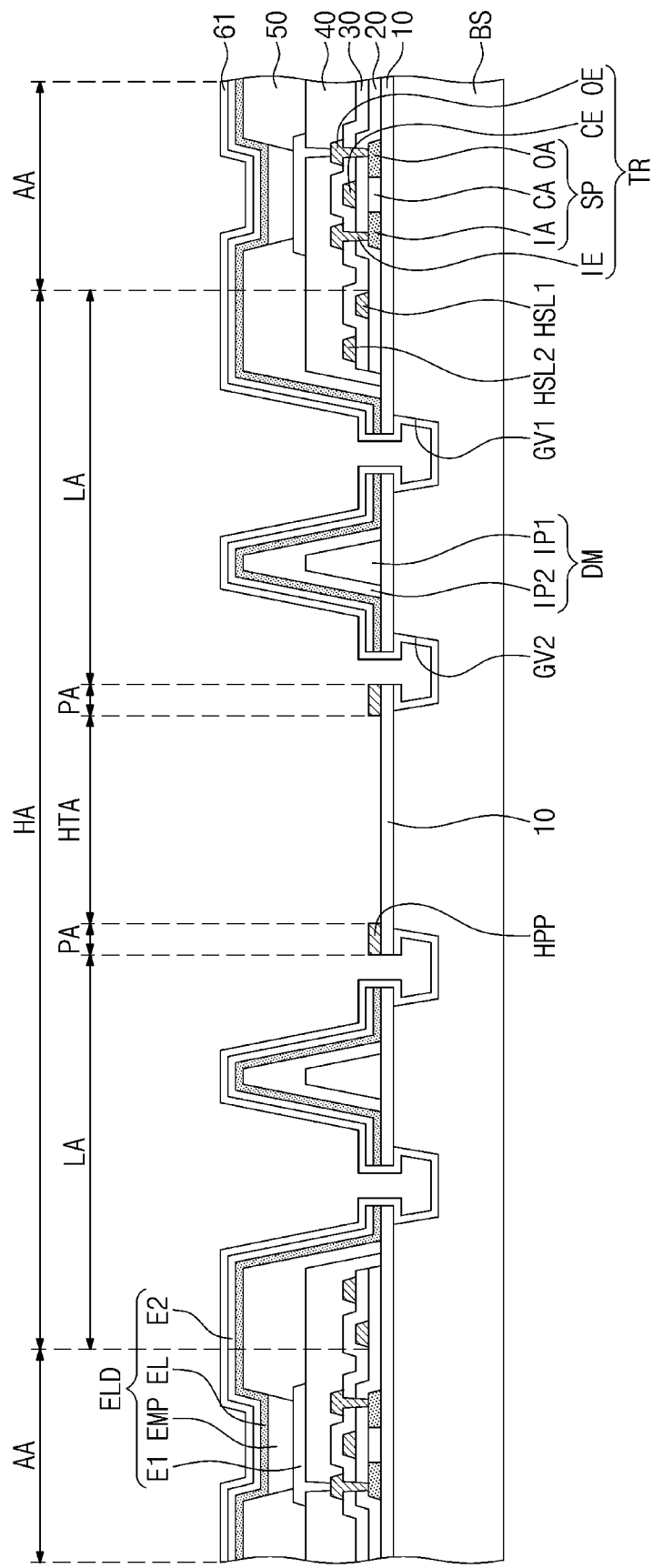

As shown in FIGS. 9H to 9J, when the cleaning process is performed, the cleaning solution CLN may enter the gap formed at the first inorganic layer 61. Therefore, the portion 61-F of the first inorganic layer 61 may be delaminated from the central region HTA and the pattern region PA.

In this case, together with the portion 61-F of the first inorganic layer 61, the second electrode E2 and the control layer EL may also be delaminated from the central region HTA and the pattern region PA. Accordingly, through the cleaning process, the first inorganic layer 61, second electrode E2 and the control layer EL may be easily removed from the central region HTA. The removal of the first inorganic layer 61, second electrode E2 and the control layer EL from the central region HTA may expose the first insulation layer 10 on the central region HTA.

Figure 9K:
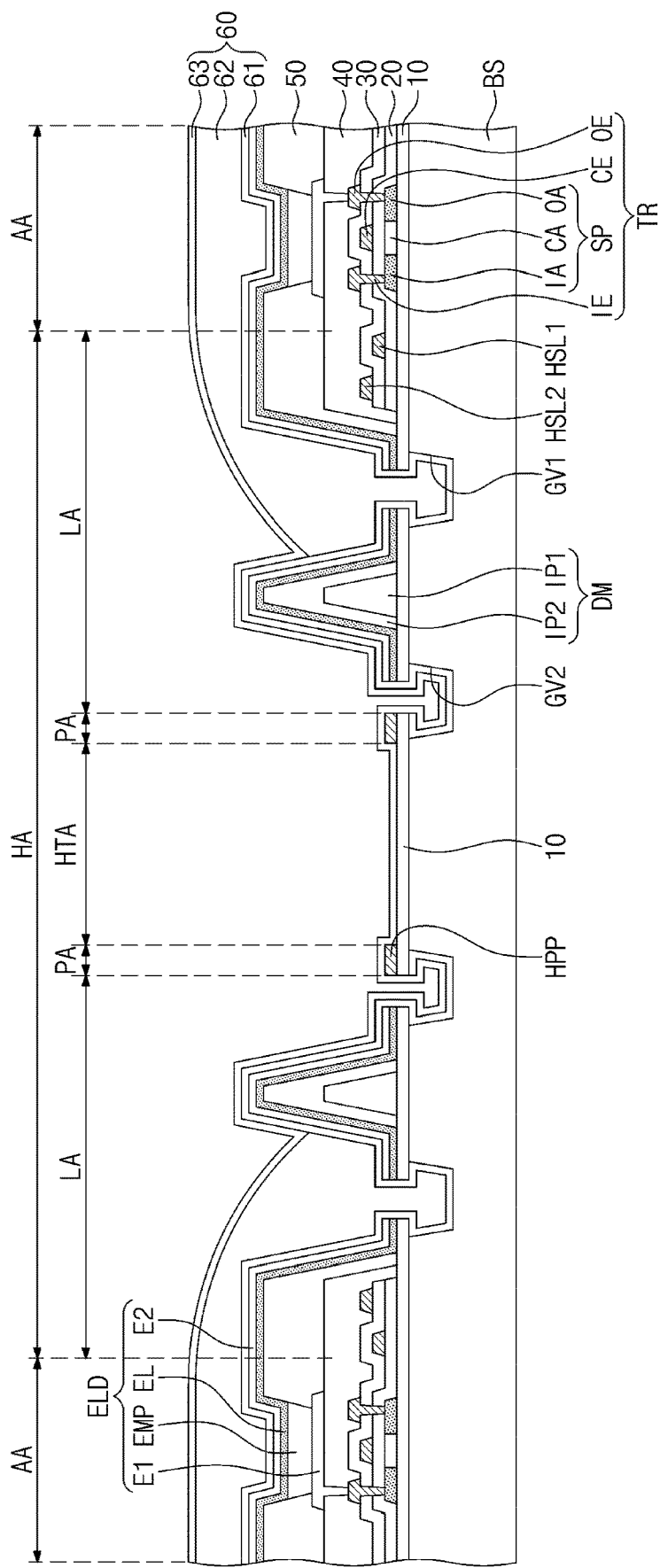

After that, as shown in FIG. 9K, an organic layer 62 and a second inorganic layer 63 are sequentially formed. The organic layer 62 may be formed by performing a coating process to coat an organic material. The coating process may include an inkjet printing process or a screen printing process. The organic layer 62 may partially fill the grooves GV1 and GV2, and the dam DM may control the formation region of the organic layer 62 in order to prevent the organic layer 62 from expanding to the central region HTA.

The second inorganic layer 63 may be formed on an entire surface of the base substrate BS. The second inorganic layer 63 may be formed by depositing an insulation material. The formation of the second inorganic layer 63 may be isotropic. Therefore, the second inorganic layer 63 may cover the inners surfaces of the grooves GV1 and GV2 having their undercut shapes. According to the present inventive concepts, because the first inorganic layer 61 is removed from the central region HTA, the second inorganic layer 63 may directly contact the first insulation layer 10 on the central region HTA.

Figure 9L:
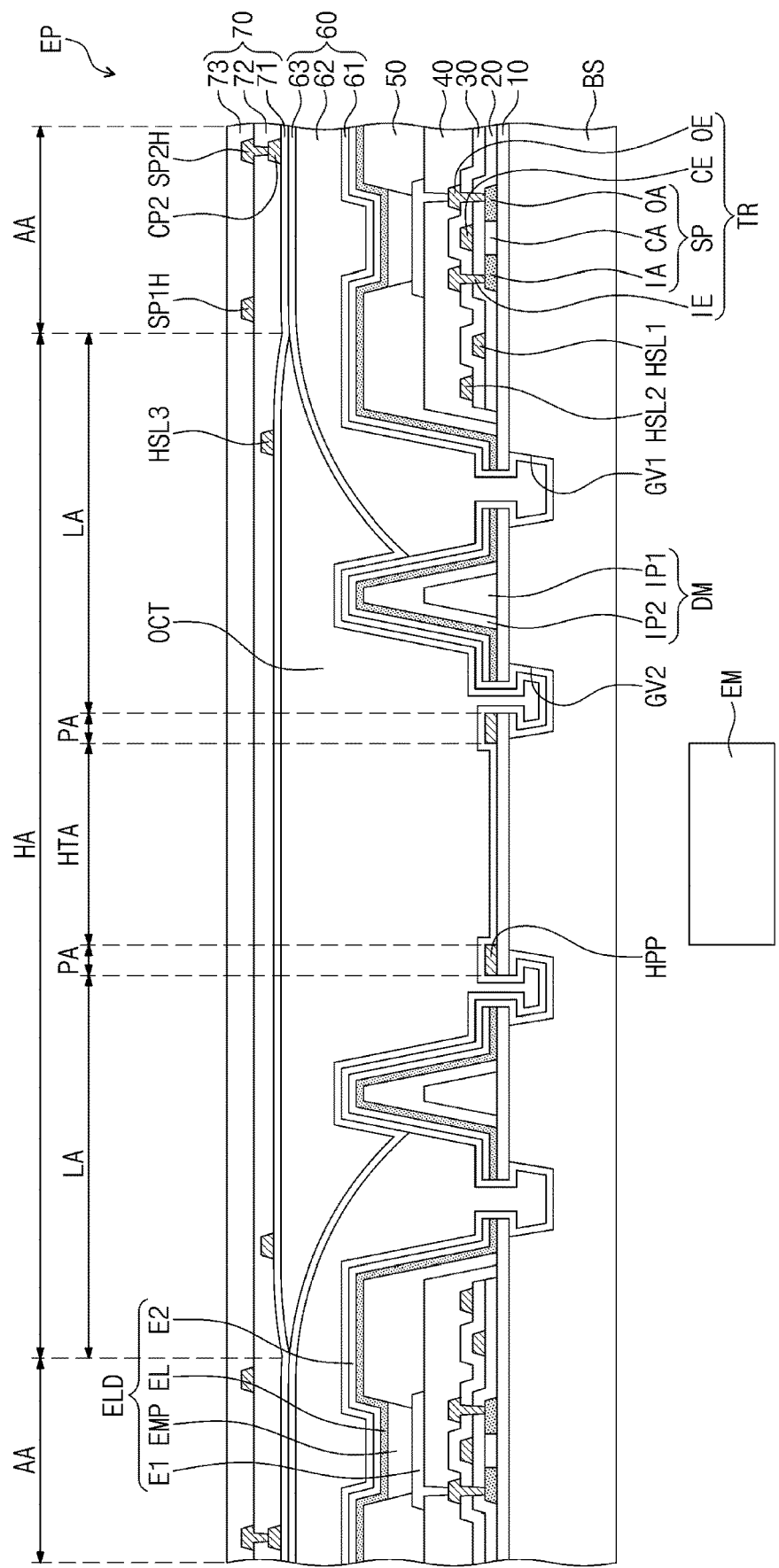

Thereafter, as shown in FIG. 9L, a planarization pattern OCT, a seventh insulation layer 70, and conductive patterns SP1H, SP2H, CP2, and HSL3 may be formed, and as a result, an electronic panel EP may be fabricated. The planarization pattern OCT may be formed in the high-transmission region HA, such that the planarization pattern OCT may provide the high-transmission region HA with a planar surface that is continuous with an active region AA.

According to the present inventive concepts, when the cleaning process is performed, the boundary pattern HPP may induce delamination of the first inorganic layer 61 and the control layer EL. Because the first inorganic layer 61 and the control layer EL that have a relatively low transmittance of visible light are easily removed from the central region HTA, the central region HTA may increase in transmittance of visible light. Accordingly, even when no hole penetrating the electronic panel EP is formed on the electronic module EM, the electronic module EM may easily receive light through the electronic panel EP, or may output and externally light through the electronic panel EP. As a result, it may be possible to increase process reliability and to provide an electronic apparatus having a reduced bezel area.

According to the present inventive concepts, because an electronic module is provided to at least partially overlap an electronic panel, a bezel region decreases in area. Furthermore, even when no bole is formed to penetrate the electronic panel, the electronic panel may be provided with a region having a high transmittance of visible light.

Although exemplary embodiments of the present disclosure have been described herein with reference to the figures, it will be understood by those of ordinary skill in the art that various changes in form and details may be made without departing from the spirit and scope of the present inventive concepts.

What is claimed is:

1. An electronic apparatus, comprising:
an electronic module that outputs and/or receives light; and
an electronic panel that is divided into a first region that overlaps the electronic module, a second region that surrounds at least a portion of the first region, and a third region adjacent to the second region,
wherein the electronic panel includes:
a base substrate;
a plurality of pixels that are disposed on the base substrate and are configured to display light in the second region;
an encapsulation layer that is disposed on the base substrate and covers the pixels in the second region; and
a boundary pattern disposed on the base substrate in the first region,
wherein the first region includes a central region and a pattern region that at least partially surrounds the central region,
wherein the boundary pattern is spaced apart from the central region and is disposed along the pattern region,
wherein the encapsulation layer includes
a first inorganic layer overlapping the second region to cover the pixels; and
a second inorganic layer disposed on the first inorganic layer in the second region and extended from the second region to the first region to overlap the first and second regions, and
wherein the first inorganic layer does not overlap the central region and the second inorganic layer is disposed on the base substrate and overlaps the base substrate in the central region.

2. The electronic apparatus of claim 1, wherein the boundary pattern has an undercut shape, wherein a groove is provided in the base substrate by being recessed from at least a portion of the base substrate, and
wherein the groove is disposed adjacent to the boundary pattern in the first region.

3. The electronic apparatus of claim 1, wherein the boundary pattern has a closed line shape that at least partially surrounds the central region.

4. The electronic apparatus of claim 1, wherein the encapsulation layer further includes:
an organic layer disposed between the first inorganic layer and the second inorganic layer.

5. The electronic apparatus of claim 1, wherein the second inorganic layer has a transmittance of visible light that is greater than a transmittance of visible light of the first inorganic layer.

6. The electronic apparatus of claim 1, further comprising:
a window disposed on the encapsulation layer; and
an antireflection layer disposed between the window and the electronic panel,
wherein:
the antireflection layer includes a hole that corresponds to the central region, and
the hole has a transmittance of visible light that is greater than a transmittance of visible light of any other part of the antireflection layer.

7. The electronic apparatus of claim 6, wherein the hole has a polarization degree that is less than a polarization degree of any other part of the antireflection layer.

8. The electronic apparatus of claim 6, wherein the hole penetrates the antireflection layer.

9. The electronic apparatus of claim 1, further comprising a sensing unit disposed on the encapsulation layer, the sensing unit including a plurality of conductive patterns and a plurality of sensing insulation layers disposed between the conductive patterns,
wherein the sensing insulation layers at least partially overlap the central region.

10. The electronic apparatus of claim 9, further comprising a planarization pattern disposed under the sensing unit,
wherein the planarization pattern at least partially overlaps the central region.

11. The electronic apparatus of claim 1, wherein
the boundary pattern includes a first layer, a second layer, and a third layer that are sequentially stacked, and
wherein a lateral surface of the third layer protrudes from a lateral surface of the second layer.

12. The electronic apparatus of claim 11, wherein the third layer includes a material that is different from a material of the second layer.

13. The electronic apparatus of claim 1, wherein the boundary pattern is electrically conductive.

14. An electronic apparatus, comprising:
an electronic module that outputs and/or receives light; and
an electronic panel that is divided into a first region that overlaps the electronic module, a second region that surrounds at least a portion of the first region, and a third region adjacent to the second region,
wherein the electronic panel includes:
a base substrate;
a plurality of pixels that are disposed on the base substrate and are configured to display light in the second region;
an encapsulation layer that is disposed on the base substrate and at least partially covers the pixels; and
a boundary pattern disposed in the first region, wherein the first region includes a central region and a pattern region that at least partially surrounds the central region, wherein the boundary pattern is spaced apart from the central region and is disposed along the pattern region, wherein the encapsulation layer includes:
- a first inorganic layer; and
- a second inorganic layer disposed on the first inorganic layer, wherein the first inorganic layer does not overlap the central region and the second inorganic layer at least partially overlaps the central region, wherein the boundary pattern is electrically conductive, wherein each of the plurality of pixels includes:
- a light emitting element in the second region; and
- a thin film transistor connected to the light emitting element, and wherein the boundary pattern is disposed on a same layer as a control electrode of the thin film transistor, an input electrode of the thin film transistor, and/or an output electrode of the thin film transistor.

15. An electronic apparatus, comprising:
an electronic module; and
an electronic panel divided into a high-transmission region that overlaps the electronic module and an active region that at least partially surrounds the high-transmission region, wherein the high-transmission region includes a central region that is spaced apart from the active region, and wherein the electronic panel includes:
- a plurality of pixels that provide the active region with light;
- a boundary pattern disposed in the high-transmission region, the boundary pattern being spaced apart from the central region and at least partially surrounding the central region; and
- an encapsulation layer that at least partially covers the pixels, the encapsulation layer including a first inorganic layer, a second inorganic layer that is disposed on the first inorganic layer and has a transmittance of visible light that is greater than a transmittance of visible light of the first inorganic layer, and an organic layer disposed between the first inorganic layer and the second inorganic layer, wherein the first inorganic layer is spaced apart from the central region and does not extend to an upper portion of the boundary pattern.

16. The electronic apparatus of claim 15, wherein each of the plurality of pixels includes:
- a light emitting element disposed in the active region; and
- a thin film transistor connected to the light emitting element, wherein the boundary pattern is disposed on a same layer as an input electrode of the thin film transistor, an output electrode of the thin film transistor, and/or a control electrode of the thin film transistor, the boundary pattern including a material that is the same as a material of the input electrode, the output electrode, and/or control electrode.

17. The electronic apparatus of claim 16, wherein the boundary pattern has an undercut shape.

18. The electronic apparatus of claim 15, wherein the boundary pattern has a closed line shape that at least partially surrounds the central region.

19. The electronic apparatus of claim 15, wherein the second inorganic layer at least partially overlaps the central region.

20. The electronic apparatus of claim 2, wherein
the first region further includes a line region that at least partially surrounds the pattern region,
the boundary pattern is disposed in the pattern region, and
the groove is disposed in the line region.

* * * * *